(12) United States Patent
Park et al.

(10) Patent No.: US 11,348,529 B2
(45) Date of Patent: May 31, 2022

(54) DISPLAY DEVICE HAVING DUMMY SCAN LINES

(71) Applicant: Samsung Display Co., Ltd., Yongin-si (KR)

(72) Inventors: Jong Won Park, Yongin-si (KR); Seung Kyu Lee, Yongin-si (KR); Hyun Woong Kim, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 166 days.

(21) Appl. No.: 15/868,961

(22) Filed: Jan. 11, 2018

(65) Prior Publication Data

US 2018/0330672 A1 Nov. 15, 2018

(30) Foreign Application Priority Data

May 11, 2017 (KR) .................. 10-2017-0058841

(51) Int. Cl.
*G09G 3/3266* (2016.01)
*G09G 3/3225* (2016.01)
*G09G 3/3233* (2016.01)
*H01L 27/32* (2006.01)

(52) U.S. Cl.
CPC ......... *G09G 3/3266* (2013.01); *G09G 3/3225* (2013.01); *G09G 3/3233* (2013.01); *G09G 2300/0413* (2013.01); *G09G 2300/0426* (2013.01); *G09G 2300/0819* (2013.01); *G09G 2300/0842* (2013.01); *G09G 2300/0861* (2013.01); *G09G 2310/0232* (2013.01); *G09G 2320/0233* (2013.01); *H01L 27/3223* (2013.01); *H01L 27/3276* (2013.01)

(58) Field of Classification Search
CPC .. G09G 3/3266; G09G 3/3225; G09G 3/3233; G09G 2320/0233; G09G 2300/0413; G09G 2300/0819; G09G 2300/0842; G09G 2300/0861; G09G 2300/0426; G09G 2310/0232; H01L 27/3223; H01L 27/3276
USPC ................................ 345/76, 87, 92, 93, 103
See application file for complete search history.

(56) References Cited

U.S. PATENT DOCUMENTS

| 6,384,878 | B1* | 5/2002 | Kwak ............... G02F 1/136204 349/192 |
| 6,795,049 | B2 | 9/2004 | Toyoshima et al. |
| 8,975,761 | B2 | 3/2015 | Jung |
| 9,632,378 | B2 | 4/2017 | Abe et al. |
| 2002/0093474 | A1* | 7/2002 | Toyoshima .......... G09G 3/3648 345/87 |
| 2007/0057875 | A1 | 3/2007 | Kwon |

(Continued)

FOREIGN PATENT DOCUMENTS

| CN | 1932938 | 3/2007 |
| CN | 101401143 | 4/2009 |

(Continued)

*Primary Examiner* — Jimmy H Nguyen
(74) *Attorney, Agent, or Firm* — H.C. Park & Associates, PLC

(57) ABSTRACT

A display device includes: pixels provided in a display area; data lines connected to the pixels, the data lines providing data signals to the pixels; scan lines connected to the pixels, the scan lines providing scan signals to the pixels; and dummy scan lines intersecting the data lines in a peripheral area surrounding the display area.

20 Claims, 13 Drawing Sheets

(56) References Cited

U.S. PATENT DOCUMENTS

| | | | |
|---|---|---|---|
| 2009/0102824 A1 | 4/2009 | Tanaka et al. | |
| 2009/0224248 A1* | 9/2009 | Yoon ................ | H01L 29/41733 |
| | | | 257/59 |
| 2010/0295830 A1 | 11/2010 | Chen | |
| 2012/0169799 A1* | 7/2012 | Ono .................... | G09G 3/3233 |
| | | | 345/690 |
| 2014/0117320 A1* | 5/2014 | Jung .................. | H01L 27/3276 |
| | | | 257/40 |
| 2016/0321990 A1* | 11/2016 | Kim .................... | G09G 3/3233 |

FOREIGN PATENT DOCUMENTS

| | | |
|---|---|---|
| CN | 101866604 | 10/2010 |
| CN | 103034003 | 4/2013 |
| KR | 20020062171 | 7/2002 |
| KR | 20120004119 | 6/2012 |
| KR | 20140053626 | 5/2014 |
| KR | 10-2016-0039892 | 4/2016 |

\* cited by examiner

DISPLAY DEVICE HAVING DUMMY SCAN LINES

CROSS-REFERENCE TO RELATED APPLICATION

This application claims priority from and the benefit of Korean Patent Application No. 10-2017-0058841, filed on May 11, 2017, which is hereby incorporated by reference for all purposes as if fully set forth herein.

BACKGROUND

Field

Exemplary embodiments relate to a display device having dummy scan lines.

Discussion of the Background

An organic light emitting display device includes two electrodes and an organic emitting layer located between the two electrodes. In the organic light emitting display device, electrons injected from one electrode and holes injected from the other electrode are combined in the organic emitting layer so as to form excitons, and the excitons emit light through energy emission.

The organic light emitting display device includes a plurality of pixels each including an organic light emitting device that is a self-luminescent device, and lines that provide various signals to each pixel are provided in the pixel. The lines are arranged in various ways so as to provide signals to each pixel.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device in which an image is displayed with uniform luminance regardless of areas.

Additional aspects will be set forth in the detailed description which follows, and, in part, will be apparent from the disclosure, or may be learned by practice of the inventive concept.

An exemplary embodiment discloses a display device including: pixels disposed in a display area; data lines connected to the pixels, the data lines providing data signals to the pixels; scan lines connected to the pixels, the scan lines providing scan signals to the pixels; and dummy scan lines intersecting the data lines in a peripheral area surrounding the display area.

The scan lines and the dummy scan lines may extend in a first direction, and the data lines may extend in a second direction intersecting the first direction.

The dummy scan lines may not be connected to the pixels.

A difference between the magnitude of a data signal supplied to pixels disposed on first pixel rows and the magnitude of a data signal supplied to pixels disposed on second pixel rows may be compensated corresponding to changes of dummy scan signals supplied to the dummy scan lines.

The second pixel rows may be located under the first pixel rows. The scan signals may be supplied earlier to the pixels disposed on the first pixel rows than the pixels disposed on the second pixel rows.

A capacitance may be formed between the dummy scan line and the data line intersecting the dummy scan line.

The display device may further include a scan driver supplying scan signals to the scan lines, the scan driver supplying the dummy scan signals to the dummy scan lines.

Each of the pixels may include a transistor. The transistor may include: an active pattern; a gate electrode provided on the active pattern with a gate insulating layer interposed therebetween; an interlayer insulating layer including a first interlayer insulating layer covering the gate electrode and a second interlayer insulating layer disposed on the first interlayer insulating layer; and source and drain electrodes disposed on the interlayer insulating layer, the source and the drain electrodes each being connected to the active pattern.

The display device may further include a first dummy electrode provided on the first interlayer insulating layer. A portion of the first dummy electrode may overlap with the dummy scan line such that the capacitance is formed between the first dummy electrode and the dummy scan line.

The first dummy electrode may be connected to a data line intersecting the dummy scan line through a contact hole passing through the second interlayer insulating layer.

The magnitude of a data signal supplied to the data line may be changed corresponding to a change of the dummy scan signal supplied to the dummy scan line.

The display device may further include a first dummy active pattern disposed on a substrate. A portion of the first dummy active pattern may overlap with the dummy scan line such that the capacitance is formed between the first dummy active pattern and the dummy scan line.

The dummy scan line may be connected to a data line intersecting the dummy scan line through contact holes passing through the gate insulating layer and the interlayer insulating layer.

The dummy scan line, the first dummy active pattern, and the data line may form a first dummy transistor.

The magnitude of a data signal supplied to the data line is changed corresponding to a change of the dummy scan signal supplied to the dummy scan line.

The display device may further include: a second dummy active pattern disposed on the substrate; a second dummy electrode disposed on the gate insulating layer; and auxiliary data lines disposed on the interlayer insulating layer.

A portion of the second dummy active pattern may overlap with the second dummy electrode such that the capacitance is formed between the second dummy active pattern and the second dummy electrode.

First ends of the auxiliary data lines may be connected to the second dummy active pattern through contact holes passing through the gate insulating layer and the interlayer insulating layer, second ends of the auxiliary data lines may be connected to the dummy scan line through contact holes passing through the interlayer insulating layer, and the second auxiliary electrode may be connected to a data line intersecting the dummy scan line through a contact hole through the interlayer insulating layer.

The second dummy active pattern, the second dummy electrode, and the auxiliary data lines may form a second dummy transistor.

The magnitude of a data signal supplied to the data signal may be changed corresponding to a change of the dummy scan signal supplied to the second dummy active pattern through the dummy scan line and the auxiliary data lines.

At least a portion of the boundary of the display area may have a curved shape.

A capacitance may be formed in each of intersection regions of the dummy scan lines and the data lines, and the magnitude of the capacitance may be changed depending on regions.

The magnitude of a capacitance may become greater as the capacitance is formed by a data line located closer to an outer portion.

An exemplary embodiment also discloses a display device including: pixels disposed in a display area; data lines providing data signals to the pixels; scan lines providing scan signals to the pixels; and dummy scan lines intersecting the data lines. When dummy scan signals are supplied to the dummy scan lines, the magnitude of a data signal supplied to the pixels changes corresponding to changes of the dummy scan signals.

The dummy scan lines may not be connected to the pixels.

The display device may further include a scan driver supplying scan signals to the scan lines, the scan driver supplying the dummy scan signals to the dummy scan lines.

Each of the scan signals may include a plurality of low level sections.

The pixels may include pixels disposed on first pixel rows and pixels disposed on second pixel rows. The magnitude of a data signal supplied to the pixels disposed on the second pixel rows may be changed in response to the dummy scan signals being supplied to the dummy scan lines.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
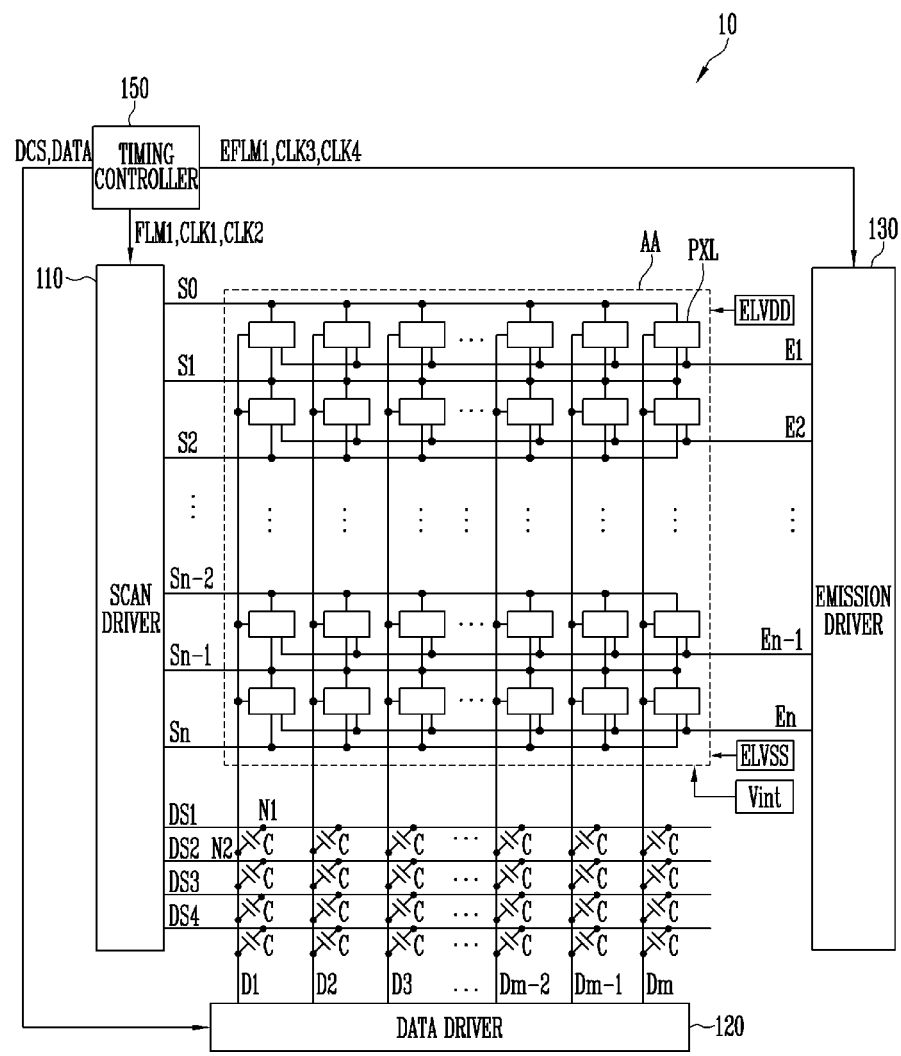
FIG. 1 is a view specifically illustrating a configuration of a display device according to an exemplary embodiment of the present disclosure.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular exemplary embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined.

Hereinafter, a display device will be described with reference to exemplary embodiments in conjunction with the accompanying drawings.

FIG. 1 is a view specifically illustrating a configuration of a display device 10 according to an exemplary embodiment of the present disclosure.

Referring to FIG. 1, the display device 10 according to the exemplary embodiment of the present disclosure may include pixels PXL and a display driving unit. The display device 10 may include a display area AA and a peripheral area that is the remaining area except the display area AA.

The display driving unit is located in the peripheral area, and may include a scan driver 110, a data driver 120, an emission driver 130, and a timing controller 150.

Pixels PXL are located in the display area AA, and may be connected to scan lines S0 to Sn, data lines D1 to Dm, and emission control lines E1 to En.

The pixels PXL may be arranged in a matrix form along a plurality of pixel rows extending in one direction and a plurality of pixel columns extending in a direction intersecting the pixel rows.

That is, the pixel rows may include pixels PXL arranged in the one direction, and the pixel columns may include pixels PXL arranged in the direction intersecting the pixel rows.

Meanwhile, in this exemplary embodiment, the case where the pixels PXL are arranged in the matrix form is illustrated as an example. However, the present disclosure is not limited thereto, and the pixels PXL may be arranged in various forms.

The pixels PXL may be supplied with data signals from the data lines D1 to Dm when scan signals are supplied from the scan lines S0 to Sn.

Each of the pixels PXL supplied with the data signal may control the amount of current flowing from a first power source ELVDD to a second power source ELVSS via an organic light emitting device (not shown). In this case, the organic light emitting device may generate light with a luminance corresponding to the amount of the current.

The display device 10 according to the exemplary embodiment of the present disclosure may include dummy scan lines DS1 to DS4. The dummy scan lines DS1 to DS4 may be located in the peripheral area. Unlike that the scan lines S0 to S1 are connected to the pixels PXL, the dummy scan lines DS1 to DS4 may not connected to the pixels PXL.

Each of the dummy scan lines DS1 to DS4 may be located to intersect the data lines D1 to Dm, and a predetermined capacitance may be formed in each of intersection regions of the dummy scan lines DS1 to DS4 and the data lines D1 to Dm.

For example, referring to FIG. 1, a load matching capacitance C may be formed between a first node N1 connected to each of the dummy scan lines DS1 to DS4 and a second node N2 connected to each of the data lines D1 to Dm.

The load matching capacitance C may perform a function of decreasing the magnitude of a data signal in a floating state. In particular, when dummy scan signals are supplied to the dummy scan lines DS1 to DS4, the level of a voltage supplied to the first node N1 is changed from a high level to a low level, and therefore, the magnitude of the data signal in the floating state may be decreased due to a coupling effect.

The scan driver 110 may supply scan signals to the scan lines S0 to Sn, corresponding to scan driver control signals FLM1, CLK1, and CLK2 supplied from the timing controller 150. Also, the scan driver 110 may supply dummy scan signals to the dummy scan lines DS1 to DS4.

For example, the scan driver 110 may sequentially supply scan signals and dummy scan signals to the scan lines S0 to Sn and the dummy scan lines DS1 to DS4. If the scan signals are sequentially supplied, the pixels PXL may be sequentially selected in unit of horizontal lines.

The emission driver 130 may supply emission control signals to the emission control lines E1 to En, corresponding to emission driver control signals EFLM1, CLK3, and CLK4 supplied from the timing controller 150.

For example, the emission driver 130 may sequentially supply emission control signals to the emission control lines E1 to En.

Meanwhile, the emission control signals may be set to a gate-off voltage (e.g., a high voltage) such that transistors included in the pixels PXL can be turned off.

In addition, the scan signals may be set to a gate-on voltage (e.g., a low voltage) such that the transistors included in the pixels PXL can be turned on.

The data driver 120 may supply data signals to the data lines D1 to Dm, corresponding to a data control signal DCS.

The data signals supplied to the data lines D1 to Dm are supplies to pixels PXL selected by each scan signal.

A predetermined switch (not shown) may be provided in the data driver 120 or between the data lines D1 to Dm and the data driver 120. If the switch is turned on, data signals are charged in the data lines D1 to Dm. If the switch is turned off, the data lines D1 to Dm may be in the floating state.

The switch may be turned off after the data signals are charged in the data lines D1 to Dm, and the data lines D1 to Dm may be in the floating state while the data signals charged in the data lines D1 to Dm are being applied to the pixels PXL, respectively.

The timing controller 150 may supply the data control signal DCS to the data driver 120. Also, the timing controller 150 may convert image data input from the outside into image data DATA suitable for specifications of the data driver 120, and supply the converted image data DATA to the data driver 120.

The data control signal may include a source start signal, a source output enable signal, a source sampling clock, and the like. The source start signal may control a data sampling start time of the data driver 120. The source sampling clock may control a sampling operation of the data driver 120, based on a rising or falling edge. The source output enable signal may control an output timing of the data driver 120.

The timing controller 150 may supply, to the scan driver 110, the scan driver control signals FLM1, CLK1, and CLK2 generated based on timing signals supplied from the outside.

The scan driver control signals may include a first start signal FLM1 and clock signals CLK1 and CLK2. The first start signal FLM1 may be used to control supply timings of scan signals, and the clock signals CLK1 and CLK2 may be used to shift the first start signal FLM1.

The timing controller 150 may supply, to the emission driver 130, the emission driver control signals EFLM1, CLK3, and CLK4 generated based on timing signals supplied from the outside.

The emission driver control signals may include a second start signal EFLM1 and clock signals CLK3 and CLK4. The second start signal EFLM1 may be used to control supply timings of emission control signals, and the clock signals CLK3 and CLK4 may be used to shift the second start signal EFLM1.

In FIG. 1, the scan driver 110, the emission control driver 130, the data driver 120, and the timing controller 150 are individually provided. However, at least some of the components may be integrated, if necessary.

In addition, the scan driver 110, the emission control driver 130, the data driver 120, and the timing controller 150 may be installed in various ways such as chip-on-glass, chip-on-plastic, tape carrier package, and chip-on-film.

Figure 2:
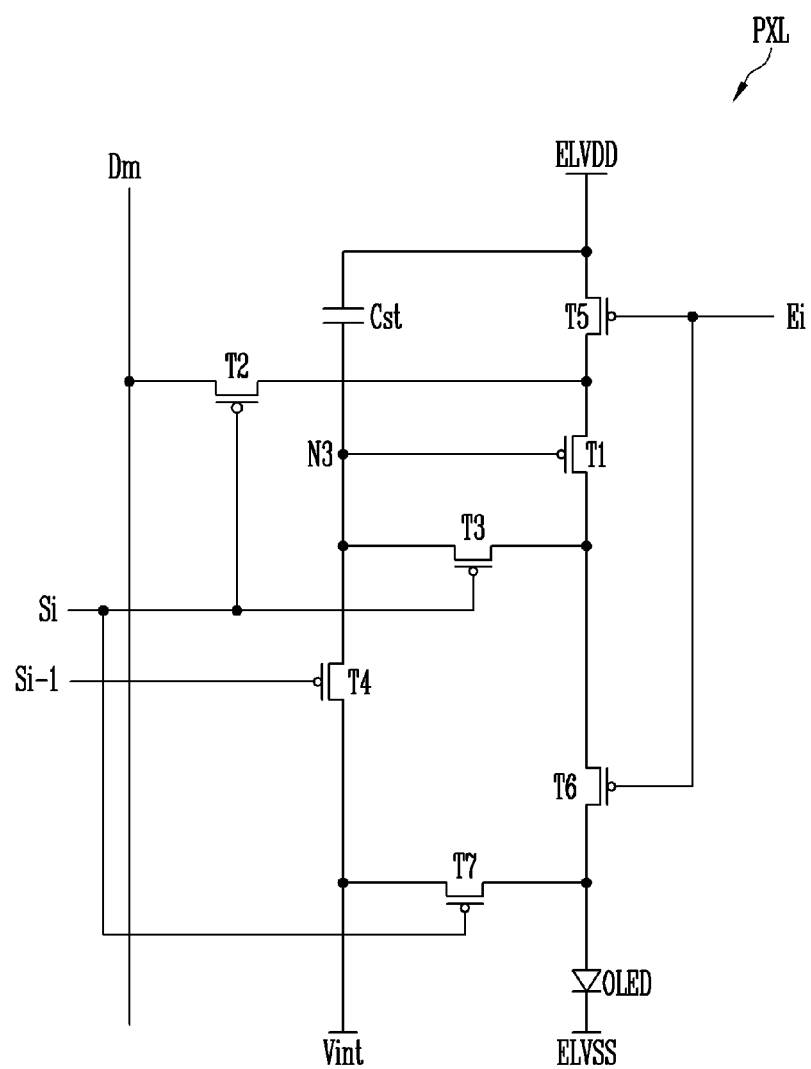
FIG. 2 is an equivalent circuit diagram illustrating an exemplary embodiment of a pixel shown in FIG. 1.

FIG. 2 is an equivalent circuit diagram illustrating an exemplary embodiment of the pixel PXL shown in FIG. 1. For convenience of description, a pixel PXL connected to an mth data line Dm and an ith scan line Si is illustrated in FIG. 2.

Referring to FIG. 2, the pixel PXL according to the exemplary embodiment of the present disclosure may include an organic light emitting device OLED, first to seventh transistors T1 to T7, and a storage capacitor Cst.

An anode of the organic light emitting device OLED may be connected to the first transistor T1 via the sixth transistor T6, and a cathode of the organic light emitting device OLED may be connected to the second power source ELVSS. The organic light emitting device OLED may generate light with a predetermined luminance corresponding to the amount of current supplied from the first transistor T1.

The first power source ELVDD may be set to a voltage higher than that of the second power source ELVSS such that current can flow through the organic light emitting device OLED.

The seventh transistor T7 may be connected between an initialization power source Vint and the anode of the organic light emitting device OLED. In addition, a gate electrode of the seventh transistor T7 may be connected to the ith scan line Si. The seventh transistor T7 may be turned on when a scan signal is supplied to the ith scan line Si, to supply the voltage of the initialization power source Vint to the anode of the organic light emitting device OLED. Here, the initialization power source Vint may be set to a voltage lower than that of a data signal.

The sixth transistor T6 may be connected between the first transistor T1 and the organic light emitting device OLED. In addition, a gate electrode of the sixth transistor T6 may be connected to an ith emission control line Ei. The sixth transistor T6 may be turned off when an emission control signal is supplied to the ith emission control line Ei, and be turned on otherwise.

The fifth transistor T5 may be connected between the first power source ELVDD and the first transistor T1. In addition, a gate electrode of the fifth transistor T5 may be connected to the ith emission control line Ei. The fifth transistor T5 may be turned off when the emission control signal is supplied to the ith emission control line Ei, and be turned on otherwise.

A first electrode of the first transistor T1 (i.e., a driving transistor) may be connected to the first power source ELVDD via the fifth transistor T5, and a second electrode of the first transistor T1 may be connected to the anode of the organic light emitting device OLED via the sixth transistor T6. In addition, a gate electrode of the first transistor T1 may be connected to a third node N3. The first transistor T1 may control the amount of current flowing from the first power source ELVDD to the second power source ELVSS via the organic light emitting device OLED, corresponding to a voltage of the third node N3.

The third transistor T3 may be connected between the second electrode of the first transistor T1 and the third node N3. In addition, a gate electrode of the third transistor T3 may be connected to the ith scan line Si. The third transistor T3 may be turned on when the scan signal is supplied to the ith scan line Si, to allow the second electrode of the first transistor T1 and the third node N3 to be electrically connected to each other. Therefore, when the third transistor T3 is turned on, the first transistor T1 may be diode-coupled.

The fourth transistor T4 may be connected between the third node N3 and the initialization power source Vint. In addition, a gate electrode of the fourth transistor T4 may be connected to an (i−1)th scan line Si-1. The fourth transistor T4 may be turned on when a scan signal is supplied to the (i−1)th scan line Si-1, to supply the voltage of the initialization power source Vint to the third node N3.

The second transistor T2 may be connected between the mth data line Dm and the first electrode of the first transistor T1. In addition, a gate electrode of the second transistor T2 may be connected to the ith scan line Si. The second transistor T2 may be turned on when the scan signal is supplied to the ith scan line Si, to allow the mth data line Dm and the first electrode of the first transistor T1 to be electrically connected to each other.

The storage capacitor Cst may be connected between the first power source ELVDD and the third node N3. The storage capacitor Cst may store a voltage corresponding to the data signal and a threshold voltage of the first transistor T1.

Figure 3:
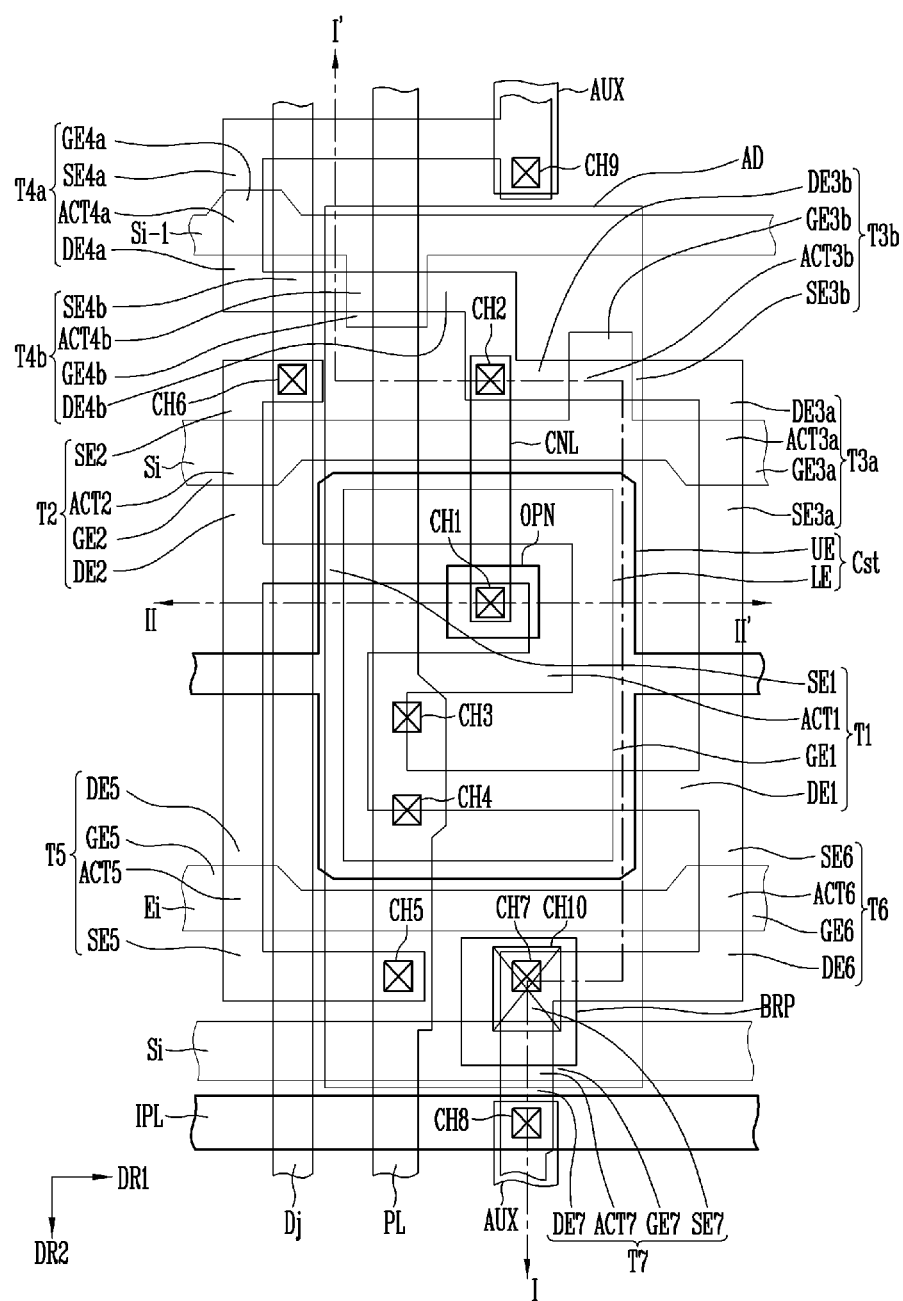
FIG. 3 is a plan view illustrating in detail the pixel shown in FIG. 2.
Figure 4:
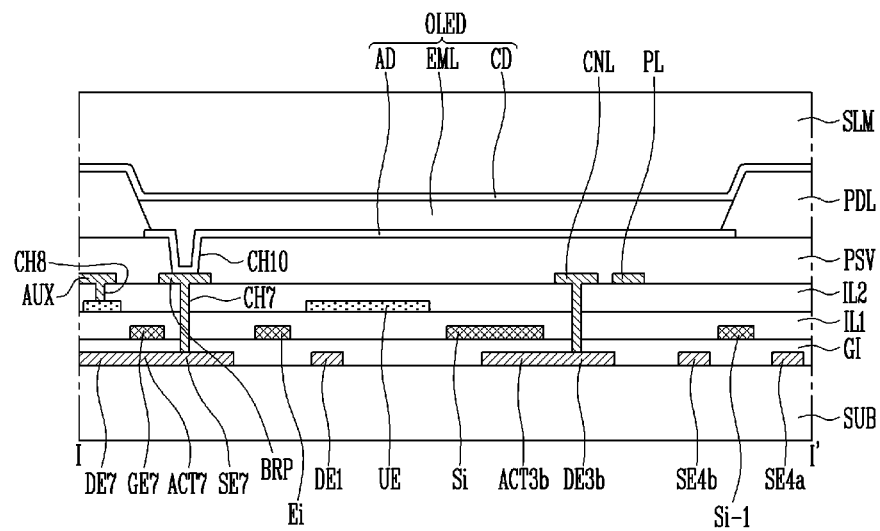
FIG. 4 is a sectional view taken along line I-I' of FIG. 3.
Figure 5:
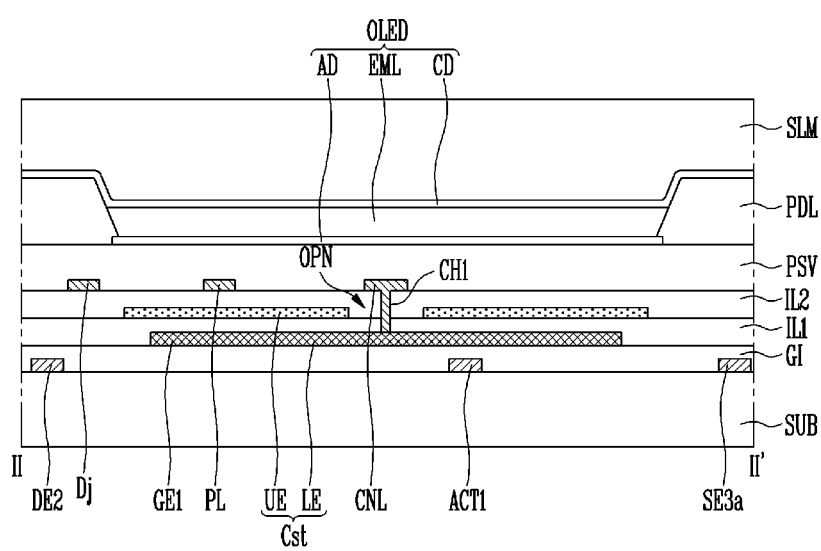
FIG. 5 is a sectional view taken along line II-II' of FIG. 3.

FIG. 3 is a plan view illustrating in detail the pixel shown in FIG. 2. FIG. 4 is a sectional view taken along line I-I' of FIG. 3. FIG. 5 is a sectional view taken along line II-II' of FIG. 3.

Based on a pixel PXL disposed on an ith row and a jth column, two scan lines Si-1 and Si, an emission control line Ei, a power line PL, and a data line Dj, which are connected to the pixel PXL, are illustrated in FIGS. 3 to 5.

In FIGS. 3 to 5, for convenience of description, a scan line on an (i−1)th row is referred to as an "(i−1)th scan line Si-1," a scan line on the ith row is referred to as an "ith scan line Si," an emission control line on the ith row is referred to as an "emission control line Ei," a data line on the jth column is referred to as a "data line Dj," and a power line on the jth column is referred to as a "power line PL."

Referring to FIGS. 3 to 5, the display device 10 may include a substrate SUB, a line unit, and pixels PXL. The substrate SUB may include a display area AA in which the pixels PXL are provided and a peripheral area that is an area except the display area AA.

The substrate SUB may include a transparent insulating material to enable light to be transmitted therethrough. The substrate SUB may be a rigid substrate. For example, the substrate SUB may be one of a glass substrate, a quartz substrate, a glass ceramic substrate, and a crystalline glass substrate.

In addition, the substrate SUB may be a flexible substrate. Here, the substrate SUB may be one of a film substrate and a plastic substrate, including a polymer organic material. For example, the substrate SUB may include at least one selected from the group consisting of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, various other materials may be used to constitute the substrate SUB, and may include a fiber reinforced plastic (FRP), etc.

The line unit provides signals to each of the pixels PXL1, and may include scan lines Si-1 and Si, a data line Dj, an emission control line Ei, a power line PL, and an initialization power line IPL.

The scan lines Si-1 and Si may extend in a first direction DR1. The first scan lines Si-1 and Si may include an (i−1)th scan line Si-1 and an ith scan line Si, which are sequentially arranged along a second direction DR2.

The scan lines Si-1 and Si may have a scan signal applied thereto. For example, an (i−1)th scan signal may be applied to the (i−1)th scan line Si-1, and an ith scan signal may be applied to the ith scan line Si.

The ith scan line Si may branch off into two lines, and the branching-off ith scan lines Si may be connected to different transistors. For example, the ith scan line Si may include an upper ith scan line Si adjacent to the (i−1)th scan line Si-1, and a lower ith scan line Si farther away from the (i−1)th scan line Si-1 than the upper ith scan line Si.

The emission control line Ei may extend in the first direction DR1. The emission control line Ei is disposed between the two ith scan lines Si to be spaced apart from the ith scan lines Si. The emission control line Ei may be applied with an emission control signal.

The data line Dj may extend in the second direction DR2. A data signal may be applied to the data line Dj.

The power line PL may extend in the second direction DR2. The power line PL may be disposed to be spaced apart from the data line Dj. The first power source ELVDD may be applied to the power line PL.

The initialization power line IPL may extend along the first direction DR1. The initialization power line IPL may be provided between the lower ith scan line Si and an (i−1)th scan line Si-1 of a pixel on a next row. The initialization power source Vint may be applied to the initialization power line IPL.

Each of the pixels PXL may include first to seventh transistors T1 to T7, a storage capacitor Cst, and a light emitting device OLED.

The first transistor T1 may include a first gate electrode GE1, the first active pattern ACT1, a first source electrode SE1, a first drain electrode DE1, and a connection line CNL.

The first gate electrode GE1 may be connected to a third drain electrode DE3 of the third transistor T3 and a fourth drain electrode DE4 of the fourth transistor T4. The connection line CNL may connect between the first gate electrode GE1 and the third and fourth drain electrodes DE3 and DE4. One end of the connection line CNL may be connected to the first gate electrode GE1 through a first contact hole CH1, and the other end of the connection line CNL may be connected to the third and fourth drain electrodes DE3 and DE4 through a second contact hole CH2.

In an exemplary embodiment of the present disclosure, the first active pattern ACT1, the first source electrode SE1, and the first drain electrode DE1 may be formed of a semiconductor layer undoped or doped with impurities. For example, the first source electrode SE1 and the first drain electrode DE1 may be formed of a semiconductor layer doped with impurities, and the active pattern ACT1 may be formed of a semiconductor layer undoped with impurities.

The first active pattern ACT1 has a bar shape extending in a predetermined direction, and may have a shape in which it is bent plural times along the extending direction.

The first active pattern ACT1 may overlap with the first gate electrode GE1 when viewed on a plane. Because the first active pattern ACT1 is formed to be long, a channel region of the first transistor T1 can be formed to be long. Thus, the driving range of a gate voltage applied to the first transistor T1 can be widened. Accordingly, the gray scale of light emitted from the organic light emitting device OLED can be minutely controlled.

The first source electrode SE1 may be connected to one end of the first active pattern ACT1. The first source electrode SE1 may be connected to a second drain electrode DE2 of the second transistor T2 and a fifth drain electrode DE5 of the fifth transistor T5. The first drain electrode DE1 may be connected to the other end of the first active pattern ACT1. The first drain electrode DE1 may be connected to a third source electrode SE3 of the third transistor T3 and a sixth source electrode SE6 of the sixth transistor T6.

The second transistor T2 may include a second gate electrode GE2, a second active pattern ACT2, and a second source electrode SE2, and the second drain electrode DE2.

The second gate electrode GE2 may be connected to the upper ith scan line Si. The second gate electrode GE2 may be provided as a portion of the upper ith scan line Si or may protrude from the upper ith scan line Si.

In an exemplary embodiment of the present disclosure, the second active pattern ACT2, the second source electrode SE2, and the second drain electrode DE2 may be formed of a semiconductor undoped or doped with impurities.

For example, the second source electrode SE2 and the second drain electrode DE2 may be formed of a semiconductor doped with impurities, and the second active pattern ACT2 may be formed of a semiconductor layer undoped with impurities.

The second active pattern ACT2 corresponds to a portion overlapping with the second gate electrode GE2. One end of the second source electrode SE2 may be connected to the second active pattern ACT2. The other end of the second source electrode SE2 may be connected to the data line Dj through a sixth contact hole CH6. One end of the second drain electrode DE2 may be connected to the second active pattern ACT2. The other end of the second drain electrode DE2 may be connected to the first source electrode SE1 of the first transistor T1 and the fifth drain electrode DE5 of the fifth transistor T5.

The third transistor T3 may be provided in a double gate structure so as to prevent a leakage current. That is, the third transistor T3 may include a transistor T3a and a transistor T3b. The transistor T3a may include a gate electrode GE3a, an active pattern ACT3a, a source electrode SE3a, and a drain electrode DE3a.

The transistor T3b may include a gate electrode GE3b, an active pattern ACT3a, a source electrode SE3b, and a drain electrode DE3b.

Hereinafter, the gate electrode GE3a and 3bth gate electrode GE3b are referred to as a third gate electrode GE3, the active pattern ACT3a and the active pattern ACT3b are referred to as a third active pattern ACT3, the source electrode SE3a and the source electrode SE3b are referred to as the third source electrode SE3, and the drain electrode DE3a and the drain electrode DE3b are referred to as the third drain electrode DE3.

The third gate electrode GE3 may be connected to the upper ith scan line Si. The third gate electrode GE3 may be provided as a portion of the upper ith scan line Si or may be provided in a shape protruding from the upper ith scan line Si.

For example, the gate electrode GE3a may protrude from the upper ith scan line Si, and the gate electrode GE3b may be provided as a portion of the upper ith scan line Si.

The third active pattern ACT3, the third source electrode SE3, and the third drain electrode DE3 may be formed of a semiconductor layer undoped or doped with impurities.

For example, the third source electrode SE3 and the third drain electrode DE3 may be formed of a semiconductor layer doped with impurities, and the third active pattern ACT3 may be formed of a semiconductor layer undoped with impurities. The third active pattern ACT3 corresponds to a portion overlapping with the third gate electrode GE3. One end of the third source electrode SE3 may be connected to the third active pattern ACT3. The other end of the third source electrode SE3 may be connected to the first drain electrode DE1 of the first transistor T1 and the sixth source electrode SE6 of the sixth transistor T6. One end of the third drain electrode DE3 may be connected to the third active pattern ACT3. The other end of the third drain electrode DE3 may be connected to the fourth drain electrode DE4 of the fourth transistor T4. Also, the third drain electrode DE3 may be connected to the first gate electrode GE1 of the first transistor T1 through the connection line CNL, the second contact hole CH2, and the first contact hole CH1.

The fourth transistor T4 may be provided in a double gate structure so as to prevent a leakage current. That is, the fourth transistor T4 may include a transistor T4a and a transistor T4b. The transistor T4a may include a gate electrode GE4a, a active pattern ACT4a, a source electrode SE4a, and a drain electrode DE4a. The transistor T4b may include a gate electrode GE4b, a active pattern ACT4b, a source electrode SE4b, and a drain electrode DE4b.

Hereinafter, the gate electrode GE4a and the gate electrode GE4b are referred to as a fourth gate electrode GE4, the active pattern ACT4a and the active pattern ACT4b are referred to as a fourth active pattern ACT4, the source electrode SE4a and the source electrode SE4b are referred to as a fourth source electrode SE4, and the drain electrode DE4a and the drain electrode DE4b are referred to as the fourth drain electrode DE4.

The fourth gate electrode GE4 may be connected to the (i−1)th scan line Si-1. The fourth gate electrode GE4 may be provided as a portion of the (i−1)th scan line Si-1 or may protrude from the (i−1)th scan line Si-1. For example, the gate electrode GE4a may be provided as a portion of the (i−1)th scan line Si-1. The gate electrode GE4b may be provided in a shape protruding from the (i−1)th scan line Si-1.

The fourth active pattern ACT4, the fourth source electrode SE4, and the fourth drain electrode DE4 may be formed of a semiconductor layer undoped or doped with impurities. For example, the fourth source electrode SE4 and the fourth drain electrode DE4 may be formed of a semiconductor layer doped with impurities, and the fourth active pattern ACT4 may be formed of a semiconductor layer undoped with impurities. The fourth active pattern ACT4 corresponds to a portion overlapping with the fourth gate electrode GE4.

One end of the fourth source electrode SE4 may be connected to the fourth active pattern ACT4. The other end of the fourth source electrode SE4 may be connected to an initialization power line IPL of a pixel PXL on an (i−1)th row and a seventh drain electrode DE7 of a seventh transistor T7 of the pixel PXL on the (i−1)th row.

An auxiliary connection line AUX may be provided between the fourth source electrode SE4 and the initialization power line IPL. One end of the auxiliary connection line AUX may be connected to the fourth source electrode SE4 through a ninth contact hole CH9. The other end of the auxiliary connection line AUX may be connected to an initialization power line IPL on the (i−1)th row through an eighth contact hole CH8 of the pixel PXL on the (i−1)th row.

One end of the fourth drain electrode DE4 may be connected to the fourth active pattern ACT4. The other end of the fourth drain electrode DE4 may be connected to the third drain electrode DE3 of the third transistor T3. Also, the fourth drain electrode DE4 may be connected to the first gate electrode GE1 of the first transistor T1 through the second contact hole CH2 and the first contact hole CH1.

The fifth transistor T5 may include a fifth gate electrode GE5, a fifth active pattern ACT5, a fifth source electrode SE5, and the fifth drain electrode DE5.

The fifth gate electrode GE5 may be connected to the emission control line Ei. The fifth gate electrode GE5 may be provided as a portion of the emission control line Ei or may protrude from the emission control line Ei.

The fifth active pattern ACT, the fifth source electrode SE5, and the fifth drain electrode DE5 may be formed of a semiconductor layer undoped or doped with impurities. For example, the fifth source electrode SE5 and the fifth drain electrode DE5 may be formed of a semiconductor layer doped with impurities, and the fifth active pattern ACT5 may be formed of a semiconductor layer undoped with impurities. The fifth active pattern ACT5 corresponds to a portion overlapping with the fifth gate electrode GE5.

One end of the fifth source electrode SE5 may be connected to the fifth active pattern ACT5. The other end of the fifth source electrode SE5 may be connected to the power line PL through a fifth contact hole CH5. One end of the fifth drain electrode DE5 may be connected to the fifth active pattern ACT5. The other end of the fifth drain electrode DE5 may be connected to the first source electrode SE1 of the first transistor T1 and the second drain electrode DE2 of the second transistor T2.

The sixth transistor T6 may include a sixth gate electrode GE6, a sixth active pattern ACT6, the sixth source electrode SE6, and a sixth drain electrode DE6.

The sixth gate electrode SE6 may be connected to the emission control line Ei. The sixth gate electrode SE6 may be provided as a portion of the emission control line Ei or may protrude from the emission control line Ei.

The sixth active pattern ACT6, the sixth source electrode SE6, and the sixth drain electrode DE6 may be formed of a semiconductor layer undoped or doped with impurities. For example, the sixth source electrode SE6 and the sixth drain electrode DE6 may be formed of a semiconductor layer doped with impurities, and the sixth active pattern ACT6 may be formed of a semiconductor layer undoped with impurities. The sixth active pattern ACT6 corresponds to a portion overlapping with the sixth gate electrode GE6.

One end of the sixth source electrode SE6 may be connected to the sixth active pattern ACT6. The other end of the sixth source electrode SE6 may be connected to the first drain electrode DE1 of the first transistor T1 and the third source electrode SE3 of the third transistor T3. One end of the sixth drain electrode DE6 may be connected to the sixth active pattern ACT6. The other end of the sixth drain electrode DE6 may be connected to a seventh source electrode SE7 of the seventh transistor T7.

The seventh transistor T7 may include a seventh gate electrode GE7, a seventh active pattern ACT7, the seventh source electrode SE7, and a seventh drain electrode DE7.

The seventh gate electrode GE7 may be connected to the lower ith scan line Si. The seventh gate electrode GE7 may be provided as a portion of the lower ith scan line Si or may be provided in a shape protruding from the lower ith scan line Si.

The seventh active pattern ACT7, the seventh source electrode SE7, and the seventh drain electrode DE7 may be formed of a semiconductor layer undoped or doped with impurities. For example, the seventh source electrode SE7 and the seventh drain electrode DE7 may be formed of a semiconductor layer doped with impurities, and the seventh active layer ACT7 may be formed of a semiconductor layer undoped with impurities. The seventh active pattern ACT7 corresponds to a portion overlapping with the seventh gate electrode GE7.

One end of the seventh source electrode SE7 may be connected to the seventh active pattern ACT7. The other end of the seventh source electrode SE7 may be connected to the sixth drain electrode DE6 of the sixth transistor T6.

One end of the seventh drain electrode DE7 may be connected to the seventh active pattern ACT7. The other end of the seventh drain electrode DE7 may be connected to the initialization power line IPL. Also, the seventh drain electrode DE7 may be connected to a fourth source electrode SE4 of a fourth transistor T4 of a pixel PXL on an (i+1)th row. The seventh drain electrode DE7 may be connected to the fourth source electrode SE4 of the fourth transistor T4 of the pixel PXL on the (i+1)th row through the auxiliary connection line AUX, the eighth contact hole CH8, and the ninth contact hole CH9.

The storage capacitor Cst may include a lower electrode LE and an upper electrode UE. The lower electrode LE may be configured as the first gate electrode GE1 of the first transistor T1.

The upper electrode UE overlaps with the first gate electrode GE1, and may cover the lower electrode LE when viewed on a plane. As the overlapping area of the upper electrode UE and the lower electrode LE is increased, the capacitance of the storage capacitor Cst may be increased. The upper electrode UE may extend in the first direction DR1.

In an exemplary embodiment of the present disclosure, a voltage having the same level as the first power source ELVDD may be applied to the upper electrode UE. The upper electrode UE may have an opening OPN in a region including the first contact hole CH1 through which the first gate electrode GE1 and the connection line CNL contact each other.

The light emitting device OLED may include a first electrode AD, a second electrode CD, and an emitting layer EML provided between the first electrode AD and the second electrode CD.

The first electrode AD may be provided in an emission region corresponding to each pixel PXL. The first electrode AD may be connected to the seventh source electrode SE7 of the seventh transistor T7 and the sixth drain electrode DE6 of the sixth transistor T6 through a seventh contact hole CH7 and a tenth contact hole CH10.

A bridge pattern BRP may be provided between the seventh contact hole CH7 and the tenth contact hole CH10. The bridge pattern BRP may connect the sixth drain electrode DE6 and the seventh source electrode SE7 to the first electrode AD.

Hereinafter, a structure of the display device according to the exemplary embodiment of the present disclosure will be described along a stacking order with reference to FIGS. 3 to 5.

The active pattern ACT1 to ACT7 (hereinafter, referred to as ACT) may be provided on the substrate SUB. The active pattern ACT may include the first to seventh active patterns ACT1 to ACT7. The first to seventh active patterns ACT1 to ACT7 may be formed of a semiconductor material.

A buffer layer (not shown) may be provided between the substrate SUB and the first to seventh active patterns ACT1 to ACT7.

A gate insulating layer GI may be provided on the substrate SUB on which the first to seventh active patterns ACT1 to ACT7 are formed.

The (i−1)th scan line Si-1, the ith scan line Si, the emission control line Ei, and the first to seventh gate electrodes GE1 to GE7 may be provided on the gate insulating layer GI.

The first gate electrode GE1 may become the lower electrode LE of the storage capacitor Cst. The second gate electrode GE2 and the third gate electrode GE3 may be integrally formed with the upper ith scan line Si. The fourth gate electrode GE4 may be integrally formed with the (i−1)th scan line Si-1. The fifth gate electrode GE5 and the sixth gate electrode GE6 may be integrally formed with the emission control line Ei. The seventh gate electrode GE7 may be integrally formed with the lower ith scan line Si.

A first interlayer insulating layer IL1 may be provided on the substrate SUB on which the (i−1)th scan line Si-1 and the like are formed.

The upper electrode UE of the storage capacitor Cst and the initialization power line IPL may be provided on the first interlayer insulating layer IL1. The upper electrode UE may cover the lower electrode LE. The upper electrode UE along with the lower electrode LE may constitute the storage capacitor Cst with the first interlayer insulating layer IL1 interposed therebetween.

A second interlayer insulating layer IL2 may be provided on the substrate SUB on which the upper electrode UE and the initialization power line IPL are disposed.

The data line Dj, the power line PL, the connection line CNL, the auxiliary connection line AUX, and the bridge pattern BRP may be provided on the second interlayer insulating layer IL2.

The data line Dj may be connected to the second source electrode SE2 through the sixth contact hole CH6 passing through the first interlayer insulating layer IL1, the second interlayer insulating layer IL2, and the gate insulating layer GI.

The power line PL may be connected to the upper electrode UE of the storage capacitor Cst through the third and fourth contact holes CH3 and CH4 passing through the second interlayer insulating layer IL2.

The power line PL may be connected to the fifth source electrode SE5 through the fifth contact hole CH5 passing through the first interlayer insulating layer IL1, the second interlayer insulating layer IL2, and the gate insulating layer GI.

The connection line CNL may be connected to the first gate electrode GE1 through the first contact hole CH1 passing through the first interlayer insulating layer IL1 and the second interlayer insulating layer IL2. Also, the connection line CNL may be connected to the third drain electrode DE3 and the fourth drain electrode DE4 through the second contact hole CH2 passing through the gate insulating layer GI, the first interlayer insulating layer IL1, and the second interlayer insulating layer IL2.

The auxiliary connection line AUX may be connected to the initialization power line IPL through the eighth contact hole CH8 passing through the second interlayer insulating layer IL2. Also, the auxiliary connection line AUX may be connected to the fourth source electrode SE4 and the seventh drain electrode DE7 of the pixel PXL1 on the (i−1)th row through the ninth contact hole CH9 passing through the gate insulating layer GI, the first interlayer insulating layer IL1, and the second interlayer insulating layer IL2.

The bridge pattern BRP may be a pattern provided as a medium connecting the sixth drain electrode DE6 to the first electrode AD between the sixth drain electrode DE6 and the first electrode AD. The bridge pattern BRP may be connected to the sixth drain electrode DE6 and the seventh source electrode SE7 through the seventh contact hole CH7 passing through the gate insulating layer GI, the first interlayer insulating layer IL1, and the second interlayer insulating layer IL2.

A protective layer PSV may be provided on the substrate SUB on which the data line Dj and the like are formed.

The light emitting device OLED may be provided on the protective layer PSV. The light emitting device OLED may include the first electrode AD, the second electrode CD, and the emitting layer EML provided between the first electrode AD and the second electrode CD.

The first electrode AD may be provided on the protective layer PSV. The first electrode AD may be connected to the bridge pattern BRP through the tenth contact hole CH10 passing through the protective layer PSV. Since the bridge pattern BRP is connected to the sixth drain electrode DE6 and the seventh source electrode SE7 through the seventh contact hole CH7, the first electrode AD can be finally connected to the sixth drain electrode DE6 and the seventh source electrode SE7.

A pixel defining layer PDL defining a light emitting region to correspond to each pixel PXL may be provided on the substrate SUB on which the first electrode AD and the like are formed. The pixel defining layer PDL may expose a top surface of the first electrode AD therethrough and protrude from the substrate SUB along the circumference of the pixel PXL.

The emitting layer EML may be provided in the light emitting region surrounded by the pixel defining layer PDL, and the second electrode CD may be provided on the emitting layer EML. An encapsulation layer SLM covering the second electrode CD may be provided on the second electrode CD.

One of the first electrode AD and the second electrode CD may be an anode electrode, and the other of the first electrode AD and the second electrode CD may be a cathode electrode. For example, the first electrode AD may be an anode electrode, and the second electrode CD may be a cathode electrode.

In addition, at least one of the first electrode AD and the second electrode CD may be a transmissive electrode. For example, when the light emitting device OLED is a bottom-emission organic light emitting device, the first electrode AD may be a transmissive electrode, and the second electrode CD is a reflective electrode.

When the light emitting device OLED is a top-emission organic light emitting device, the first electrode AD may be a reflective electrode, and the second electrode CD may be a transmissive electrode.

When the light emitting device OLED is a dual-emission light emitting device, both of the first electrode AD and the second electrode CD may be transmissive electrodes.

In this exemplary embodiment, a case where the light emitting device OLED is a top-emission organic light emitting device and the first electrode AD is an anode electrode is described as an example.

The first electrode AD may include a reflective layer (not shown) capable of reflecting light and a transparent conductive layer (not shown) disposed over or under the reflective layer. At least one of the transparent conductive layer and the reflective layer may be connected to the sixth drain electrode DE6.

The reflective layer may include a material capable of reflecting light. For example, the reflective layer may include at least one selected from the group consisting of aluminum (Al), silver (Ag), chromium (Cr), molybdenum (Mo), platinum (Pt), nickel (Ni), and alloys thereof.

The transparent conductive layer may include a transparent conductive oxide. For example, the transparent conductive layer may include at least one transparent conductive oxide selected from indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

The pixel defining layer PDL may include an organic insulating material. For example, the pixel defining layer PDL may include at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, and silane based resin.

The emitting layer EML may be disposed on the exposed surface of the first electrode AD. The emitting layer EML may have a multi-layered thin film structure at least including a light generation layer (LGL).

For example, the emitting layer EML may include a hole injection layer (HIL) for injecting holes, a hole transport layer (HTL) having an excellent hole transporting property, the HTL for increasing the opportunity for holes and electrons to be re-combined by suppressing the movement of electrons that fail to be combined in the LGL, the LGL for emitting light through the re-combination of the injected electrons and holes, a hole blocking layer (HBL) for suppressing the movement of holes that fail to be combined in the LGL, an electron transport layer (ETL) smoothly transporting electrons to the LGL, and an electron injection layer (EIL) for injecting electrons. In the emitting layer EML, the HIL, HTL, HBL, ETL, and EIL may be common layers commonly disposed in pixels PXL adjacent to each other.

The color of light generated in the LGL may be one of red, green, blue, and white, but this exemplary embodiment is not limited thereto. For example, the color of light generated in the LGL may also be one of magenta, cyan, and yellow.

The HIL, HTL, HBL, ETL, and EIL may be common layers connected in adjacent emission regions.

The second electrode CD may be a semi-transmissive reflective layer. For example, the second electrode CD may be a thin metal layer having a thickness, through which light emitted through the emitting layer EML can be transmitted. The second electrode CD may transmit a portion of the light emitted from the emitting layer EML therethrough, and may reflect the rest of the light emitted from the emitting layer EML.

The second electrode CD may include a material having a work function lower than that of the transparent conductive layer. For example, the second electrode CD may be include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and alloys thereof.

A portion of the light emitted from the emitting layer EML may not be transmitted through the second electrode CD, and the light reflected from the second electrode CD may be again reflected from the reflective layer. That is, the light emitted from the emitting layer EML may resonate between the reflective layer and the second electrode CD. The light extraction efficiency of the light emitting device OLED can be improved by the resonance of the light.

The distance between the reflective layer and the second electrode CD may be changed depending on a color of the light emitted from the emitting layer EML. That is, the distance between the reflective layer and the second electrode CD may be adjusted to correspond to a resonance distance, depending on a color of the light emitted from the emitting layer EML.

The encapsulation layer SLM can prevent oxygen and moisture from infiltrating into the light emitting device OLED. The encapsulation layer SLM may include a plurality of inorganic layers (not shown) and a plurality of organic layers (not shown). For example, the encapsulation layer SLM may include a plurality unit encapsulation layers including the inorganic layer and the organic layer disposed on the inorganic layer. In addition, the inorganic layer may be disposed at the uppermost portion of the encapsulation layer SLM. The inorganic layer may include at least one selected from the group consisting of silicon oxide, silicon nitride, silicon oxynitride, aluminum oxide, titanium oxide, zirconium oxide, and tin oxide.

Figure 6:
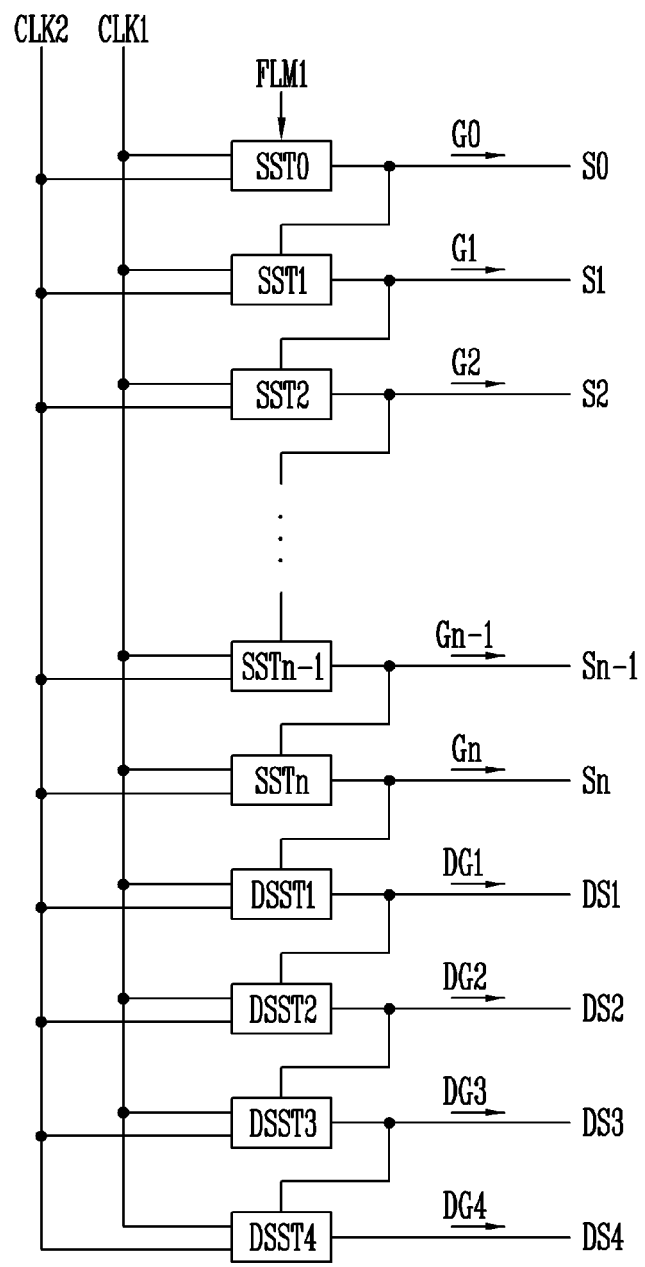
FIG. 6 is a view illustrating in detail a configuration of a scan driver shown in FIG. 1.

FIG. 6 is a view illustrating in detail a configuration of the scan driver shown in FIG. 1.

Referring to FIG. 6, the scan driver 110 may include scan stages SST0 to SSTn.

The scan stages SST0 to SSTn may be connected to first ends of the scan lines S0 to Sn, respectively. Accordingly, the scan stages SST0 to SSTn can supply scan signals G0 to Gn to the scan lines S0 to Sn, respectively.

The scan stages SST0 to SSTn may be operated corresponding to the clock signals CLK1 and CLK2 supplied from the timing controller 150. Also, the scan stages SST0 to SSTn may be implemented with the same circuit.

A start scan stage SST0 may be supplied with the first start signal FLM1 supplied from the timing controller 150. In addition, each of the other scan stages SST1 to SSTn may be supplied with an output signal (i.e., a scan signal) of a previous stage thereof.

For example, a first scan stage SST1 may be supplied with an output signal G0 of the start scan stage SST0, and a second scan stage SST2 may be supplied with an output signal (G1) of the first scan stage SST1.

According to an exemplary embodiment of the present disclosure, the scan driver 110 may include dummy scan stages DSST1 to DSST4.

The dummy scan stages DSST1 to DSST4 may be connected to first ends of the dummy scan lines DS1 to DS4, respectively. Accordingly, the dummy scan stages DSST1 to DSST4 can supply dummy scan signals DG1 to DG4 to the dummy scan lines DS1 to DS4, respectively.

The dummy scan stages DSST1 to DSST4 may be operated corresponding to the clock signals CLK1 and CLK2 supplied from the timing controller 150. Also, the dummy scan stages DSST1 to DSST4 may be implemented with the same circuit as the scan stages SST0 to SSTn.

A first dummy scan stage DSST1 may be supplied with an output signal Gn of the last scan stage SSTn, and each of the other dummy scan stages DSST2 to DSST4 may be supplied with an output signal (i.e., a dummy scan signal) of a previous dummy scan stage thereof.

Meanwhile, in FIGS. 1 and 6, the clock signals include a first clock signal CLK1 and a second clock signal CLK2. However, the present disclosure is not limited thereto, and the number of clock signals supplied to the scan driver 110 may be variously changed.

Figure 7:
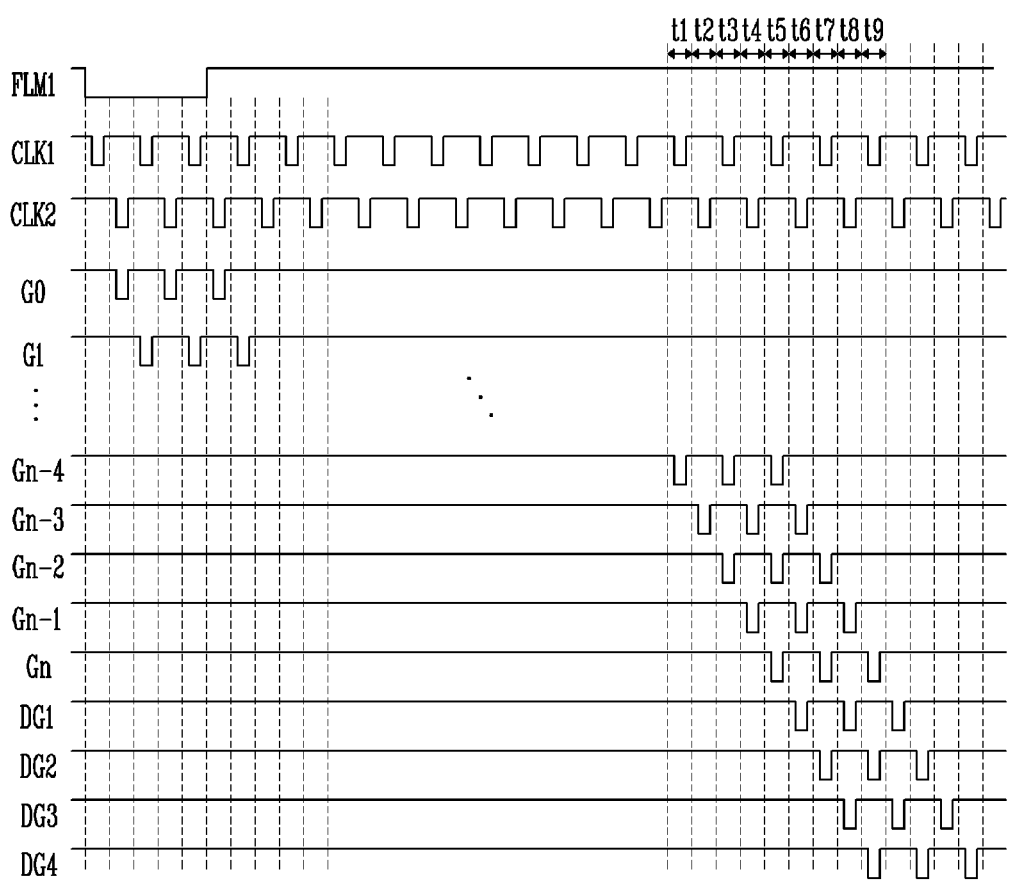
FIG. 7 is a waveform diagram illustrating output timings of scan signals output from the scan driver.

FIG. 7 is a waveform diagram illustrating output timings of scan signals output from the scan driver.

First, referring to FIG. 7, the timing controller 150 may supply the first start signal FLM1 to the start scan stage SST0.

A low level section of the first start signal FLM1 may be set to overlap with two or more low level sections of the first clock signal CLK1.

For example, as shown in FIG. 7, the low level section of the first start signal FLM1 may overlap with three low level sections of the first clock signal CLK1.

If the first start signal FLM1 is supplied, the scan signals G0 to Gn may be sequentially output.

Specifically, the start scan stage SST0 may output a scan single G0 by shifting the first start signal FLM1, corresponding to the clock signals CLK1 and CLK2.

In particular, the number of low level sections of the scan signal G0 may correspond to the number of low level sections of the first clock signal CLK1, which overlap with the low level section of the first start signal FLM1. That is, the scan signal G0 may have three low level sections, and each of the other scan signals may also have three low level sections.

Actually, each pixel PXL may emit light, corresponding to a data signal supplied in the last low level section among the three low level sections.

The next scan stage SST1 may output a first scan signal G1 by shifting the scan signal G0. The other scan signals G2 to Gn may be sequentially output in the above-described manner.

The first dummy scan stage DSST1 may output a first dummy scan signal DG1 by shifting the output signal Gn of the last scan stage SSTn. The other dummy scan signals DG2 to DG4 may be sequentially output in the above-described manner.

The first dummy scan signal DG1 may have three low level sections, and each of the other dummy scan signals DG2 to DG4 may also have three low level sections.

Hereinafter, a case where the magnitude of a data signal charged in a data line in the floating state is decreased as the dummy scan signals DG1 to DG4 are supplied to the dummy scan lines DS1 to DS4 will be described with reference to FIGS. 1 and 7.

Referring to FIG. 1, the voltage of the first node N1 may correspond to a dummy scan signal, and the voltage of the second node N2 may correspond to a data signal charged in a data signal.

If the level of the first dummy scan signal DG1 is changed from the high level to the low level at a sixth time t6, the voltage of the second node N2 may be decreased by ΔV due to the coupling effect, and ΔV may be expressed by the following Equation 1.

$$\Delta V = C \div C \div C \text{data} \times (VGH - VGL) \qquad \text{Equation 1}$$

In Equation 1, VGH denotes the magnitude of a voltage corresponding to the high level of the first dummy scan signal DG1, VGL denotes the magnitude of a voltage corresponding to the low level of the first dummy scan signal DG1, C denotes a load matching capacitance C, and Cdata denotes a capacitance between other lines (or active patterns, but the dummy scan lines are excluded) that overlap with the data line.

Referring to FIG. 7, first to (n−4)th scan signals G0 to Gn-4 do not overlap with the dummy scan signals DG1 to DG4. On the other hand, (n−3)th to nth scan signals Gn-3 to Gn overlap with the dummy scan signals DG1 to DG4.

When it is assumed that first to (n−4)th pixel rows are first pixel rows and the other pixel rows are second pixel rows, a data signal of which voltage is decreased by ΔV may be charged in pixels PXL disposed on the second pixel rows.

Meanwhile, the magnitude of the load matching capacitance C may be designed by considering the storage capacitor Cst provided in each of the pixels PXL, the magnitude of Cdata, a parasitic capacitor formed in each of the pixels PXL, and the like.

According to an exemplary embodiment of the present disclosure, the data signal may be simultaneously supplied to pixels PXL located on a plurality of pixel rows.

For example, referring to FIG. 7, the last low level section of the (n−4)th scan signal Gn-4, the second low level section of the (n−2)th scan signal Gn-2, and the first low level section of the nth scan signal Gn may overlap with one another.

Figure 8A:
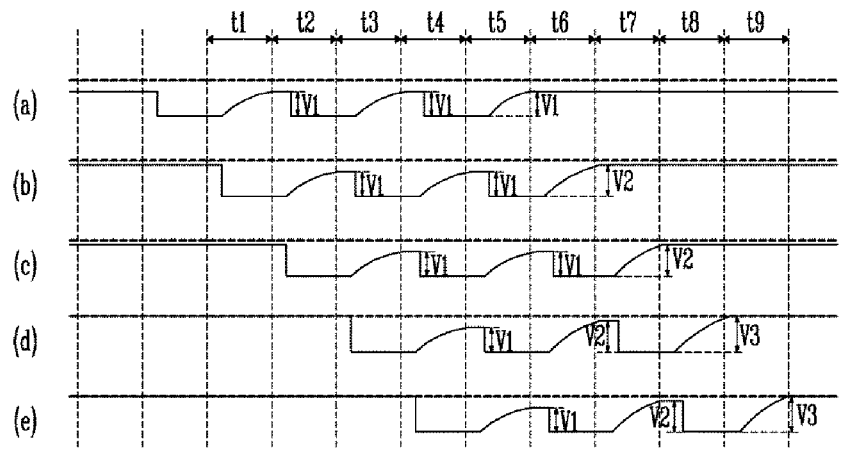
FIG. 8A and FIG. 8B are views exemplarily illustrating waveforms of data signals supplied to gate electrodes of driving transistors of pixels.
Figure 8B:
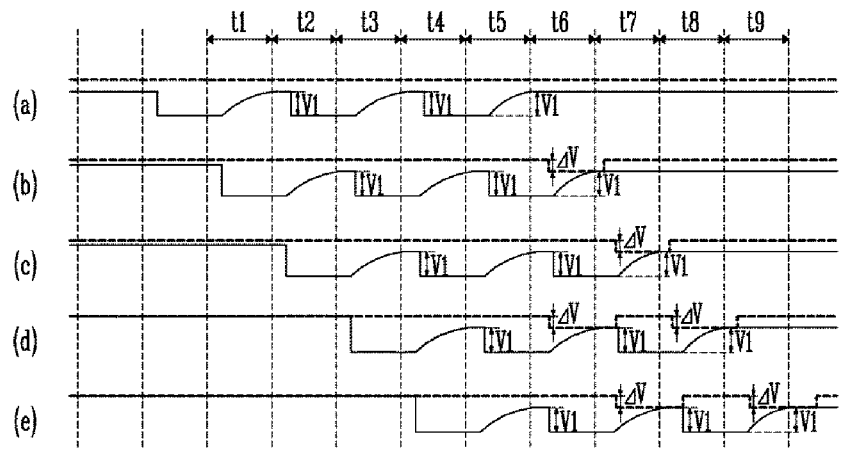

Since the pixels PXL are supplied with data signals when scan signals are supplied, data signals may be simultaneously supplied to pixels PXL located on the (n−4)th pixel row, and pixels PXL located on the (n−2)th pixel row, and pixels PXL located on the nth pixel row FIG. 8A is a view exemplarily illustrating waveforms of data signals supplied to gate electrodes of driving transistors of pixels according to a conventional art, and FIG. 8B is a view exemplarily illustrating waveforms of data signals supplied to gate electrodes of driving transistors of pixels according to the present disclosure.

In FIGS. 8A and 8B, for convenience of description, as for pixels connected to a jth data line, a data signal supplied to a gate electrode of a driving transistor (corresponding to the first transistor T1 shown in FIG. 2) of a pixel located on an (n−4)th pixel row is illustrated in (a), a data signal supplied to a gate electrode of a driving transistor of a pixel located on an (n−3)th pixel row is illustrated in (b), a data signal supplied to a gate electrode of a driving transistor of a pixel located on an (n−2)th pixel row is illustrated in (c), a data signal supplied to a gate electrode of a driving transistor of a pixel located on an (n−1)th pixel row is illustrated in (d), and a data signal supplied to a gate electrode of a driving transistor of a pixel located on an nth pixel row is illustrated in (e). In addition, it is assumed that data signals having the same magnitude are applied to the respective pixels.

In addition, waveforms corresponding data signals charged in data lines, instead of the data signals supplied to the gate electrodes of the driving transistors of the respective pixels PXL, are indicated by a bold dotted line in FIGS. 8A and 8B.

Referring to FIGS. 7 and 8A, as a scan signal is supplied to pixels PXL located on the (n−4)th pixel row in a first period t1, a third period t3, and a fifth period t5, a data signal as shown in (a) of FIG. 8A may be applied to the gate electrode of the driving transistor of the pixel that is located on the (n−4)th pixel row and is coupled to the jth data line.

In particular, during the fifth period t5, data signals are supplied to pixels disposed on three pixel rows including the (n−4)th pixel row, and a data signal may be charged by a first valve V1 in the pixel located on the (n−4)th pixel row.

Next, as a scan signal is supplied to pixels PXL located on the (n−3)th pixel row in a second period t2, a fourth period t4, and a sixth period t6, a data signal as shown in (b) of FIG. 8A may be applied to the gate electrode of the driving transistor of the pixel that is located on the (n−3)th pixel row and is coupled to the jth data line.

In particular, during the sixth period t6, data signals are supplied to pixels disposed on two pixel rows including the (n−3)th pixel row, and a data signal may be charged by a second value V2 in the pixel located on the (n−3)th pixel row. In this case, the second value V2 may be greater than the first value V1.

That is, although the same data signal is applied to the (n−4)th pixel row and the (n−3)th pixel row, speeds at which the data signal is applied to the (n−4)th pixel row and the (n−3)th pixel row are different from each other. Therefore, the luminance of the (n−3)th pixel row may be viewed as brighter than the luminance of the (n−4)th pixel row.

As a scan signal is supplied to pixels PXL located on the (n−2)th pixel row in the third period t3, the fifth period t5, and a seventh period t7, a data signal as shown in (c) of FIG. 8A may be applied to the gate electrode of the driving transistor of the pixel that is located on the (n−2)th pixel row and is coupled to the jth data line.

In particular, during the seventh period t7, data signals are supplied to pixels disposed on two pixel rows including the (n−2)th pixel row, and a data signal may be charged by the second value V2 in the pixel located on the (n−2)th pixel row.

As the number of pixel rows to which a data signal is simultaneously applied increases, a load increases, and accordingly, the charging speed of the data signal may be delayed. Therefore, the second value V2 may be greater than the first value V1.

That is, although the same data signal is applied to the (n−4)th pixel row and the (n−2)th pixel row, speeds at which the data signal is applied to the (n−4)th pixel row and the (n−2)th pixel row are different from each other. Therefore, the luminance of the (n−2)th pixel row may be viewed more brightly than the luminance of the (n−4)th pixel row.

As a scan signal is supplied to pixels PXL located on the (n−1)th pixel row in the fourth period t4, the sixth period t6, and an eighth period t8, a data signal as shown in (d) of FIG. 8A may be applied to the gate electrode of the driving transistor of the pixel that is located on the (n−1)th pixel row and is coupled to the jth data line.

In particular, during the eighth period t8, data signals are supplied to the pixel disposed on the (n−1)th pixel row, and a data signal may be charged by a third value V3 in the pixel located on the (n−1)th pixel row. In this case, the third value V3 may be greater than the second value V2.

That is, although the same data signal is applied to the (n−2)th pixel row and the (n−1)th pixel row, speeds at which the data signal is applied to the (n−2)th pixel row and the (n−1)th pixel row are different from each other. Therefore, the luminance of the (n−1)th pixel row may be viewed more brightly than the luminance of the (n−2)th pixel row.

Finally, as a scan signal is supplied to pixels PXL located on the nth pixel row in the fifth period t5, the seventh period t7, and a ninth period t9, a data signal as shown in (e) of FIG. 8 may be applied to the gate electrode of the driving transistor of the pixel that is located on the nth pixel row and is coupled to the jth data line.

In particular, during the ninth period t9, data signals are supplied to the pixels disposed on the nth pixel row, and a data signal may be charged by the third value V3 to the pixel located on the nth pixel row. In this case, the third value V3 may be greater than the second value V2.

That is, although the same data signal is applied to the (n−2)th pixel row and the nth pixel row, speeds at which the data signal is applied to the (n−2)th pixel row and the nth pixel row are different from each other. Therefore, the luminance of the nth pixel row may be viewed more brightly than the luminance of the (n−2)th pixel row. However, according to an exemplary embodiment of the present disclosure, the magnitude of the data signal supplied to the pixels may be decreased during the sixth to ninth periods t6 to t9 in which the dummy scan signals DG1 to DG4 are supplied. Therefore, a data signal may be charged by the first value V1 or a value similar to the first value V1 in pixels disposed on the last four pixel rows.

Referring to FIGS. 7 and 8B, as the first dummy scan signal DG1 is supplied during the sixth period t6, the magnitude of a data signal is decreased by ΔV, and a data signal charged in the pixel PXL is also decreased corresponding to the decreased data signal.

That is, during the sixth period t6, a data signal having the first value V1 is charged in the pixel PXL located on the (n−3)th pixel row as shown in (b) of FIG. 8B. As shown in (d) of FIG. 8B, the data signal having the first value V1 may also be charged in the pixels PXL located on the (n−1)th pixel row.

Next, as a second dummy scan signal DG2 is supplied during the seventh period t7, the magnitude of a data signal is decreased by ΔV, and a data signal charged in the pixel PXL is also decreased corresponding to the decreased data signal.

That is, during the seventh period t7, a data signal having the first value V1 is charged in the pixel PXL located on the (n−2)th pixel row as shown in (c) of FIG. 8B. As shown in (e) of FIG. 8B, the data signal having the first value V1 may also be charged in the pixels PXL located on the nth pixel row.

Next, as a third dummy scan signal DG3 is supplied during the eighth period t8, the magnitude of a data signal is decreased by ΔV, and a data signal charged in the pixel PXL is also decreased corresponding to the decreased data signal.

That is, during the eighth period t8, a data signal having the first value V1 may be charged in the pixel PXL located on the (n−1)th pixel row as shown in (d) of FIG. 8B.

Finally, during the ninth period t9, as a fourth dummy scan signal DG4 is supplied through the ninth period t9, the magnitude of a data signal is decreased by ΔV, and a data signal charged in the pixel PXL is also decreased corresponding to the decreased data signal.

That is, during the ninth period t9, a data signal having the first value V1 is charged in the pixel PXL located on the nth pixel row as shown in (e) of FIG. 8B. Referring to FIG. 8B, a data signal is charged by the first value in the pixels disposed on the last four pixel rows, and accordingly, an image can be displayed with uniform luminance.

Figure 9:
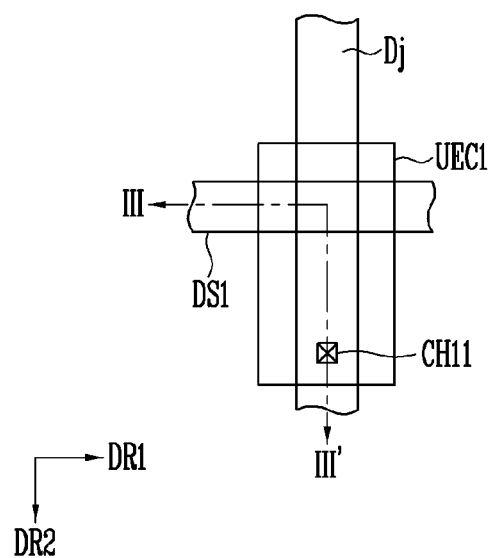
FIG. 9 is a plan view illustrating in detail an intersection region of a dummy scan line and a data line.
Figure 10:
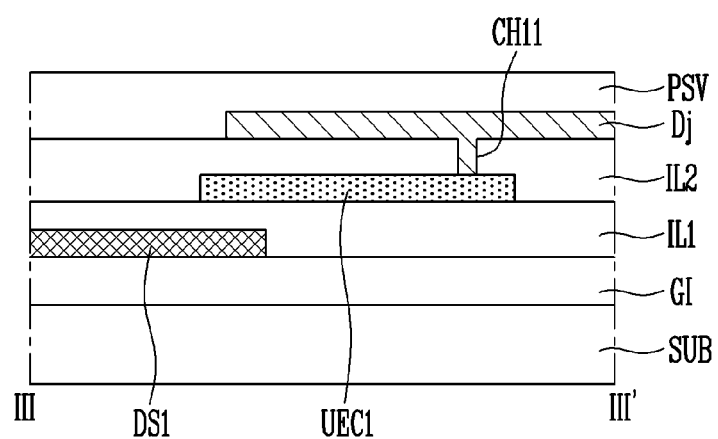
FIG. 10 is a sectional view taken along line III-III' of FIG. 9.

FIG. 9 is a plan view illustrating in detail an intersection region of a dummy scan line and a data line. FIG. 10 is a sectional view taken along line of FIG. 9.

In particular, for convenience of description, an intersection region of a first dummy scan line DS1 and a jth data line Dj is illustrated in FIGS. 9 and 10. In FIGS. 9 and 10, components identical to those of FIGS. 3 to 5 are designated by like reference numerals, and descriptions of contents overlapping with those of FIGS. 3 to 5 are omitted.

The first dummy scan line DS1 may extend in the first direction DR1. The first dummy scan line DS1 may be applied with the first dummy scan signal DG1.

The jth data line Dj may extend in the second direction DR2. A data signal may be applied to the jth data line Dj.

A first dummy electrode UEC1 may overlap with a portion of the first dummy scan line DS1 and a portion of the jth data line Dj. In particular, the first dummy electrode UEC1 may cover a region in which the first dummy scan line DS1 and the jth data line Dj intersect each other.

The first dummy electrode UEC1 may be connected to the jth data line Dj through an eleventh contact hole CH11.

A load matching capacitance C may be formed between the first dummy scan line DS1 and the first dummy electrode UEC1, which intersect each other.

Hereinafter, a structure of the display device according to the exemplary embodiment of the present disclosure will be described along a stacking order.

A gate insulating layer GI may be provided on a substrate SUB.

The first dummy scan line DS1 may be provided on the gate insulating layer GI. The first dummy scan line DS1 may be simultaneously formed with the scan lines S0 to Sn in the same layer.

A first interlayer insulating layer IL1 may be provided on the substrate SUB having the first dummy scan line DS1 formed thereon.

The first dummy electrode UEC1 may be provided on the first interlayer insulating layer IL1. The first dummy electrode UEC1 may cover the first dummy scan line DS1, and the first dummy electrode UEC1 and the first dummy scan line DS1 may constitute a capacitor forming a load matching capacitance C with the first interlayer insulating layer IL1 interposed therebetween.

The first dummy electrode UEC1 may be simultaneously formed with the upper electrode UE and the initialization power line IPL in the same layer.

A second interlayer insulating layer IL2 may be provided on the substrate SUB having the first dummy electrode UEC1 disposed thereon.

The jth data line Dj may be provided on the second interlayer insulating layer IL2. The jth data line Dj may be connected to the first dummy electrode UEC1 through the eleventh contact hole CH11 passing through the second interlayer insulating layer IL2.

Referring to FIGS. 1, 9, and 10, the first dummy scan line DS1 may correspond to the first node N1, and the eleventh contact hole CH11 may correspond to the second node N2.

Figure 11:
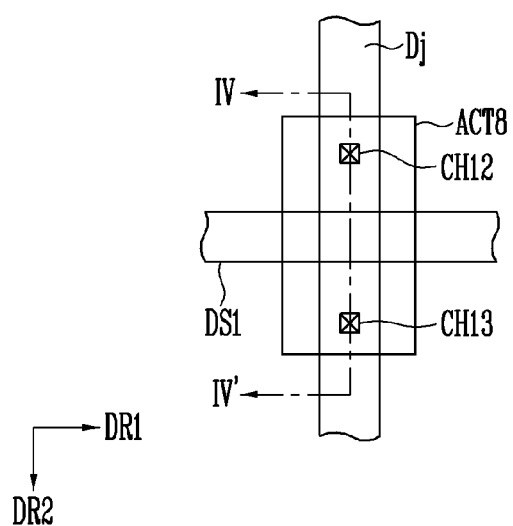
FIG. 11 is a plan view illustrating in detail an intersection region of the dummy scan line and the data line according to another exemplary embodiment of the present disclosure.
Figure 12:
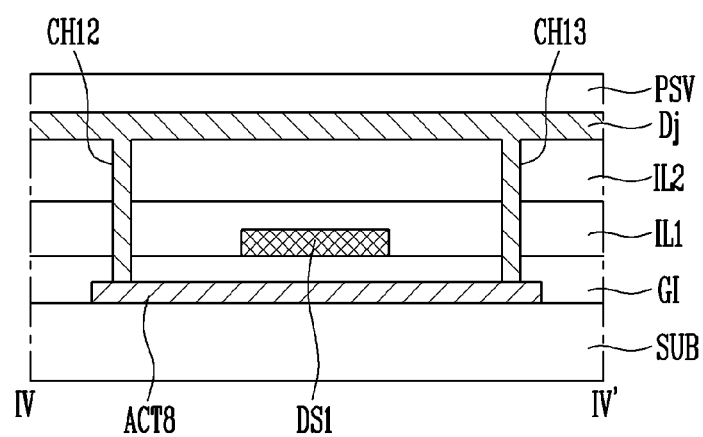
FIG. 12 is a sectional view taken along line IV-IV' of FIG. 11.

FIG. 11 is a plan view illustrating in detail an intersection region of the dummy scan line and the data line according to another exemplary embodiment of the present disclosure. FIG. 12 is a sectional view taken along line IV-IV' of FIG. 11.

In particular, for convenience of description, an intersection region of a first dummy scan line DS1 and a jth data line Dj is illustrated in FIGS. 11 and 12. In FIGS. 11 and 12, components identical to those of FIGS. 3 to 5 are designated by like reference numerals, and descriptions of contents overlapping with those of FIGS. 3 to 5 are omitted.

The first dummy scan line DS1 may extend in the first direction DR1. The first dummy scan line DS1 may be applied with the first dummy scan signal DG1.

The jth data line Dj may extend in the second direction DR2. A data signal may be applied to the jth data line Dj.

A first dummy active pattern ACT8 may be formed of a semiconductor layer undoped with impurities.

The first dummy active pattern ACT8 may overlap with the first dummy scan line DS1 when viewed in a plan view. Also, the first dummy active pattern ACT8 may also overlap with the jth data line Dj when viewed in a plan view. In this case, the first dummy active pattern ACT8 may be connected to the jth data line Dj through a twelfth contact hole CH12 and a thirteenth contact hole CH13.

The first dummy active pattern ACT8, the first dummy scan line DS1, and the jth data line Dj may constitute a first dummy transistor. In this case, the first dummy scan line DS1 may become a gate electrode of the first dummy transistor, the jth data line Dj may become source and drain electrodes, and the first dummy active pattern ACT8 may become a channel.

A load matching capacitance C may be formed between the first dummy active pattern ACT8 and the first dummy scan line DS1, which overlap with each other.

Hereinafter, a structure of the display device according to another exemplary embodiment of the present disclosure will be described according to a stacking order.

The first dummy active pattern ACT8 may be provided on a substrate SUB. The first dummy active pattern ACT8 may be formed of a semiconductor material. In this case, the first dummy active pattern ACT8 may be simultaneously formed with the first to seventh active patterns ACT1 to ACT7 in the same layer.

A gate insulating layer GI may be provided on the substrate SUB having the first dummy active pattern ACT8 formed thereon.

The first dummy scan line DS1 may be provided on the gate insulating layer GI. The first dummy scan line DS1 may be simultaneously formed with the scan lines S0 to Sn in the same layer.

A first interlayer insulating layer IL1 and a second interlayer insulating layer IL2 may be provided on the substrate SUB having the first dummy scan line DS1 formed thereon.

The jth data line Dj may be provided on the second interlayer insulating layer IL2. The jth data line Dj may be connected to the first dummy active pattern ACT8 through the twelfth contact hole CH12 and the thirteenth contact hole CH13, which pass through the gate insulating layer GI, the first interlayer insulating layer IL1, and the second interlayer insulating layer IL2.

In this case, a load matching capacitance C may be formed between the first dummy active pattern ACT8 and the first dummy scan line DS1.

FIGS. 1, 11, and 12, the first dummy scan line DS1 may correspond to the first node N1, and the twelfth contact hole CH12 or the thirteenth contact hole CH13 may correspond to the second node N2.

Figure 13:
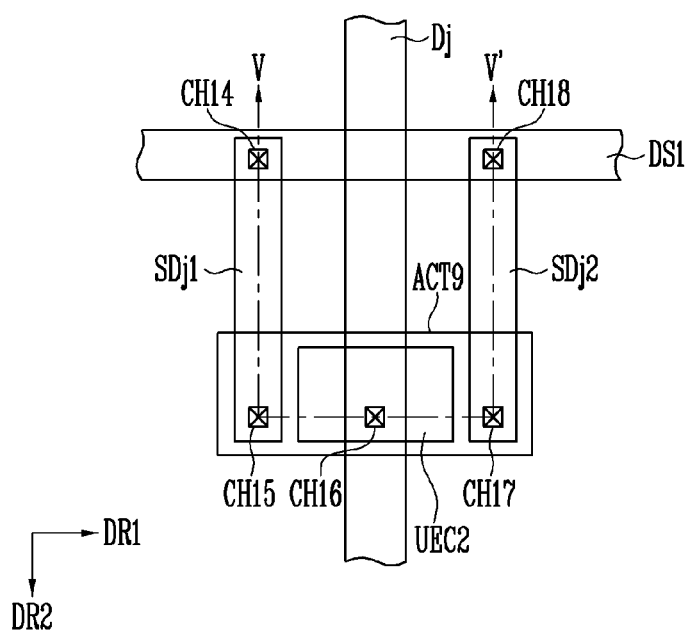
FIG. 13 is a plan view illustrating in detail an intersection region of the dummy scan line and the data line according to still another exemplary embodiment of the present disclosure.
Figure 14:
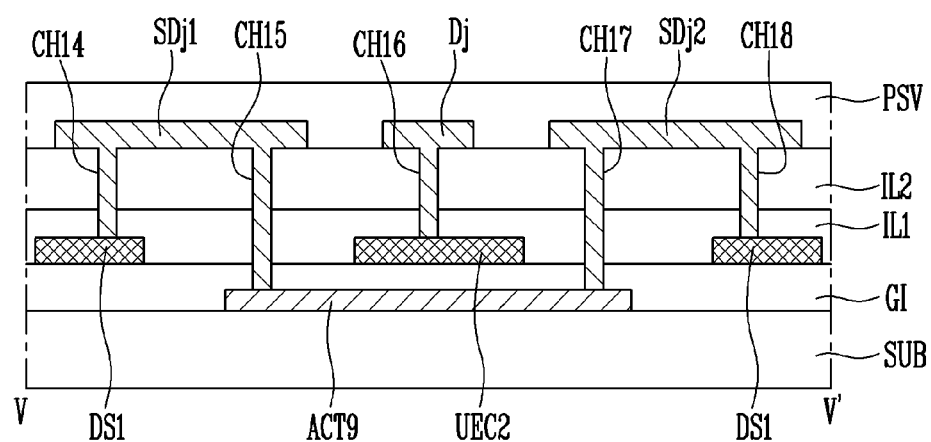
FIG. 14 is a sectional view taken along line V-V' of FIG. 11.

FIG. 13 is a plan view illustrating in detail an intersection region of the dummy scan line and the data line according to still another exemplary embodiment of the present disclosure. FIG. 14 is a sectional view taken along line V-V' of FIG. 11.

In particular, for convenience of description, an intersection region of a first dummy scan line DS1 and a jth data line Dj is illustrated in FIGS. 13 and 14. In FIGS. 13 and 14, components identical to those of FIGS. 3 to 5 are designated by like reference numerals, and descriptions of contents overlapping with those of FIGS. 3 to 5 are omitted.

The first dummy scan line DS1 may extend in the first direction DR1. The first dummy scan signal DG1 may be applied to the first dummy scan line DS1.

The jth data line Dj may extend in the second direction DR2. A data signal may be applied to the jth data line Dj.

A second dummy electrode UEC2 may overlap with a portion of the jth data line Dj. The second dummy electrode UEC2 and the jth data line Dj may be connected to each other through a sixteenth contact hole CH16.

A first auxiliary data line SDj1 and a second auxiliary data line SDj2 may extend along the second direction DR2 while being spaced apart from each other, and the second dummy electrode UEC2 may be located between the first auxiliary data line SDj1 and the second auxiliary data line SDj2.

The first auxiliary data line SDj1 and the second auxiliary data line SDj2 may supply the first dummy scan signal DG1 to a second dummy active pattern ACT9.

To this end, one end of the first auxiliary data line SDj1 may be connected to the first dummy scan line DS1 through a fourteenth contact hole CH14, and the other end of the first auxiliary data line SDj1 may be connected to the second dummy active pattern ACT9 through a fifteenth contact hole CH15.

In addition, one end of the second auxiliary data line SDj2 may be connected to the first dummy scan line DS1 through a seventeenth contact hole CH17, and the other end of the second auxiliary data line SDj2 may be connected to the second dummy active pattern ACT9 through an eighteenth contact hole CH18.

The second dummy active pattern ACT9 may be formed of a semiconductor layer undoped with impurities. The second dummy active pattern ACT9 may overlap with portions of the first auxiliary data line SDj 1, the second auxiliary data line SDj2, and the jth data line Dj. The second dummy active pattern ACT9 may also overlap with the second dummy electrode UEC2.

The second dummy active pattern ACT9, the second dummy electrode UEC2, the first auxiliary data line SDj1, and the second auxiliary data line SDj2 may constitute a second dummy transistor. In this case, the second dummy electrode UEC2 may become a gate electrode of the second dummy transistor, the first auxiliary data line SDj1 and the second auxiliary data line SDj2 may become a source electrode and a drain electrode, respectively, and the second dummy active pattern ACT9 may become a channel.

A load matching capacitance C may be formed between the second dummy electrode UEC2 and the second dummy active pattern ACT9, which overlap with each other.

Hereinafter, a structure of the display device according to the still another exemplary embodiment of the present disclosure will be described according to a stacking order.

The second dummy active pattern ACT9 may be provided on a substrate SUB. The second dummy active pattern ACT9 may be formed of a semiconductor material. In this case, the second dummy active pattern ACT9 may be simultaneously formed with the first to seventh active pattern ACT1 to ACT7 and the first dummy active pattern ACT8 in the same layer.

A gate insulating layer GI may be provided on the substrate SUB having the second dummy active pattern ACT9 formed thereon.

The first dummy scan line DS1 and the second dummy electrode UEC2 may be provided on the gate insulating layer GI. The first dummy scan line DS1 and the second dummy electrode UEC2 may be simultaneously formed with the scan lines S0 to Sn in the same layer.

A first interlayer insulating layer IL1 and a second interlayer insulating layer IL2 may be provided on the substrate SUB on the first dummy scan line DS1 and the like are formed.

The jth data line Dj, the first auxiliary data line SDj1 and the second auxiliary data line SDj2 may be provided on the second interlayer insulating layer IL2.

The jth data line Dj may be connected to the second dummy electrode UEC2 through the sixteenth contact hole CH16 passing through the first interlayer insulating layer IL1 and the second interlayer insulating layer IL2.

In addition, the first auxiliary data line SDj1 may be connected to the first dummy scan line SD1 through the fourteenth contact hole CH14 passing through the first interlayer insulating layer IL1 and the second interlayer insulating layer IL2. The first auxiliary data line SDj1 may be connected to the second dummy active pattern ACT9 through the fifteenth contact hole CH15 passing through the gate insulating layer GI, the first interlayer insulating layer IL1, and the second interlayer insulating layer IL2. Therefore, the second dummy active pattern ACT9 may be connected to the first dummy scan line SD1 through the first auxiliary data line SDj 1.

In addition, the second auxiliary data line SDj2 may be connected to the first dummy scan line DS1 through the eighteenth contact hole CH18 passing through the first interlayer insulating layer IL1 and the second interlayer insulating layer IL2. The second auxiliary data line SDj2 may be connected to the second dummy active pattern ACT9 through the seventeenth contact hole CH17 passing through the gate insulating layer GI, the first interlayer insulating layer IL1, and the second interlayer insulating layer IL2. Therefore, the second dummy active pattern ACT9 may be connected to the first dummy scan line DS1 through the second auxiliary data line SDj2.

Referring to FIGS. 1, 13, and 14, the fourteenth contact hole CH14 or the eighteenth contact hole CH18 may correspond to the first node N1, and the sixteenth contact hole CH16 may correspond to the second node N2.

Meanwhile, in FIGS. 1 to 14 a load matching capacitance C is formed by disposing a dummy electrode between the dummy scan lines DS1 to DS4 and the data lines D1 to Dm, or a capacitance between a channel region and a gate electrode of a transistor connected to the dummy scan lines DS1 to DS4 and the data lines D1 to Dm is used as the load matching capacitance. However, the present disclosure is not limited thereto.

Figure 15:
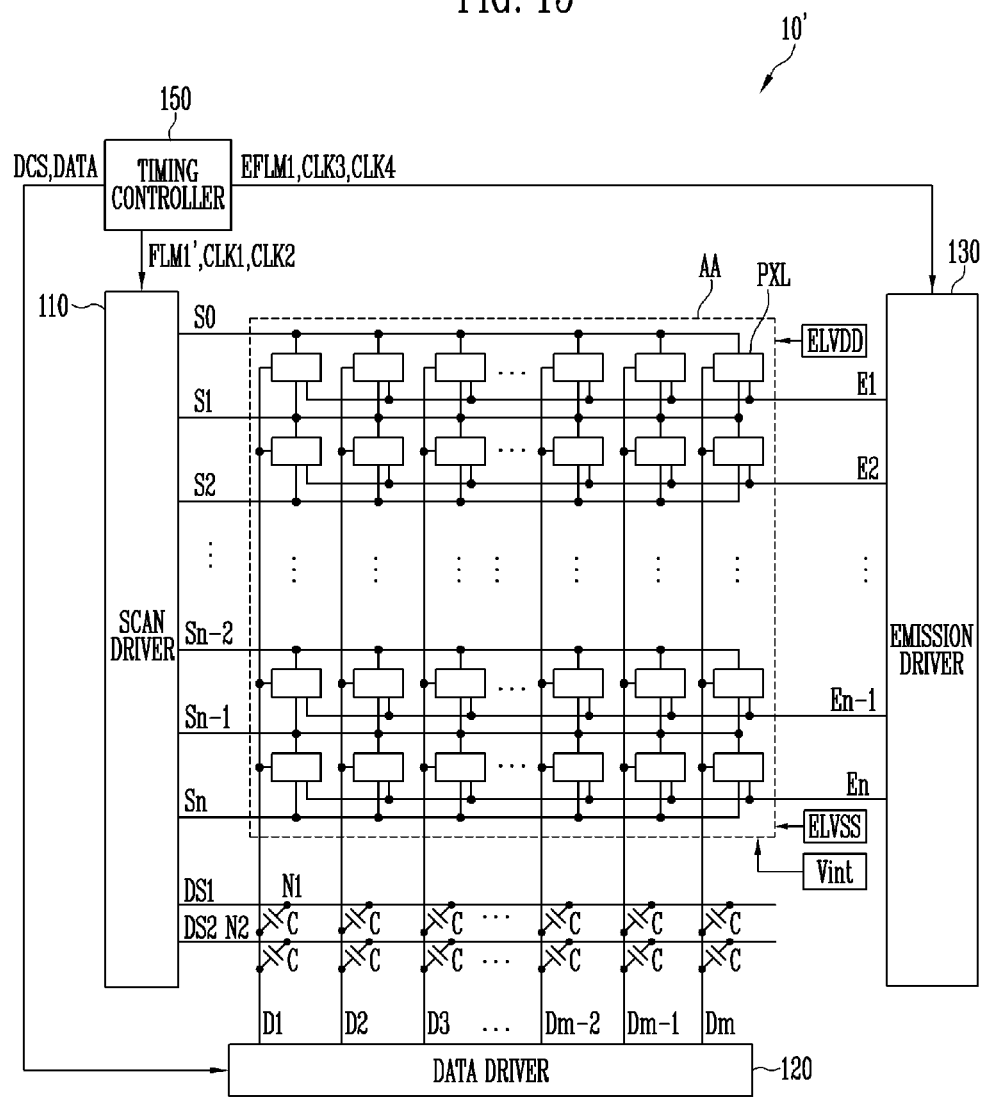
FIG. 15 is a view specifically illustrating a configuration of a display device according to another exemplary embodiment of the present disclosure.
Figure 16:
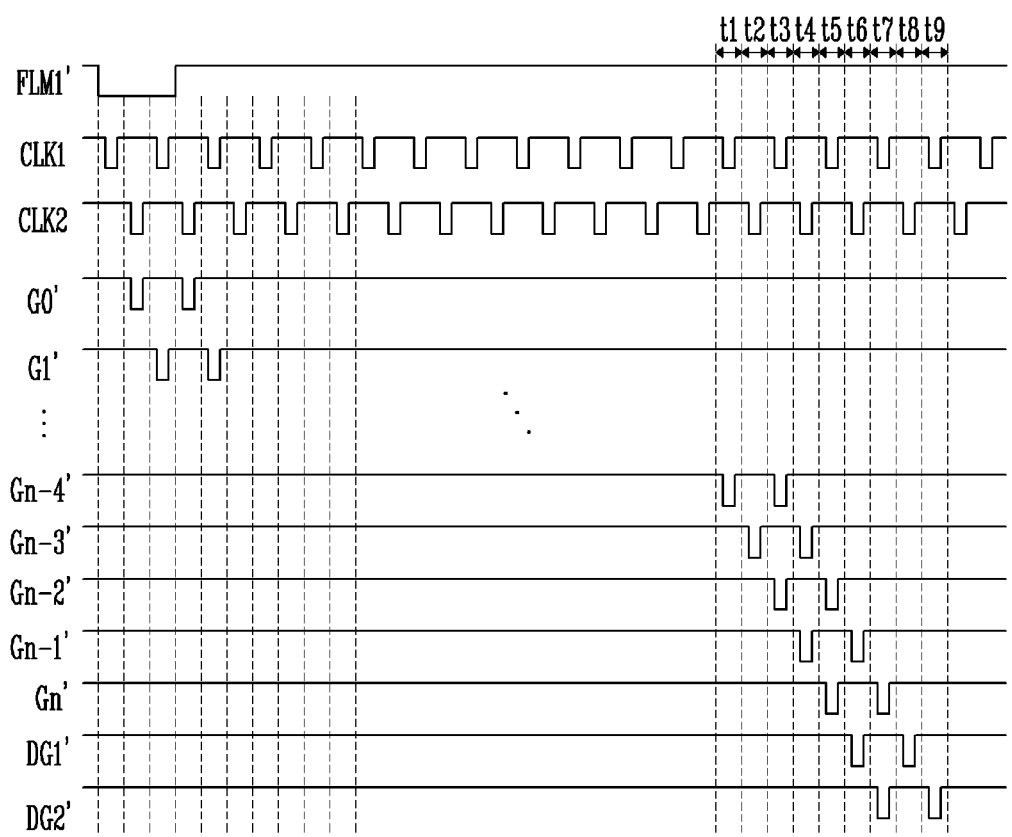
FIG. 16 is a waveform diagram illustrating output timings of scan signals output from the scan driver according to another exemplary embodiment of the present disclosure.

FIG. 15 is a view specifically illustrating a configuration of a display device according to another exemplary embodiment of the present disclosure. FIG. 16 is a waveform diagram illustrating output timings of scan signals output from the scan driver according to another exemplary embodiment of the present disclosure.

In FIGS. 15 and 16, components identical to those of FIGS. 1 and 7 are designated by like reference numerals, and descriptions of contents overlapping with those of FIGS. 1 and 7 are omitted.

Referring to FIG. 15, two dummy scan lines DS1 and DS2 may be provided at the outside of the display area AA of the display device 10'.

The timing controller 150 may supply a first start signal FLM1' to the start scan stage SST0.

Unlike what is shown in FIG. 7, a low level section of the first start signal FLM1' may overlap with two low level sections of the first clock signal CLK1.

If the first start signal FLM1' is supplied, scan signals G0' to Gn' may be sequentially output.

Specifically, the start scan stage SST0 may output a scan signal G0' by shifting the first start signal FLM1', corresponding to the clock signals CLK1 and CLK2.

In particular, the number of low level sections of the scan signal G0' may correspond to the number of low level sections of the first clock signal CLK1, which overlap with the low level section of the first start signal FLM1'. That is, the scan signal G0' may have two low level sections, and each of the other scan signals G1' to Gn' may also have two low level sections.

Actually, each of the pixels PXL may emit light, corresponding to a data signal supplied in the last low level section between the two low level section.

The next scan stage SST1 may output a first scan signal G1' by shifting the scan signal G0'. The other scan signals G2' to Gn' may be sequentially output in the above-described manner.

The first dummy scan stage DSST1 may output a first dummy scan signal DG1' by shifting an output signal Gn' of the last scan stage SSTn. The other dummy scan signal DG2' may be sequentially output in the above-described manner.

The first dummy scan signal DG1' may have two low level section, and the other dummy scan signal DG2' may also have two low level sections.

Referring to FIG. 16, the last low level section of each of scan signals supplied to the first to (n−3)th pixel rows overlap with a first low level section of another scan signal.

If the dummy scan lines DS1 and DS2 for forming a predetermined capacitance are not provided, the last low level section of each of scan signals to the (n−1)th pixel row and the nth pixel row does not overlap with the low level section of another scan signal.

That is, a delay value of the data signal supplied to the first to (n−3)th pixel rows is greater than that of the data signal supplied to the (n−1)th pixel row and the nth pixel row, and therefore, a luminance variation between the pixel rows may occur.

However, according to an exemplary embodiment of the present disclosure, two dummy scan lines for decreasing the luminance of the (n−1)th pixel row and the nth pixel row may be provided.

The number of dummy scan lines may be determined according to the number of low level sections included in each scan signal (or the number of pixel rows to which a data signal supplied through one data line is simultaneously supplied). That is, the number of dummy scan lines is not limited to those shown in FIGS. 1 and 15, and may be variously changed.

Figure 17:
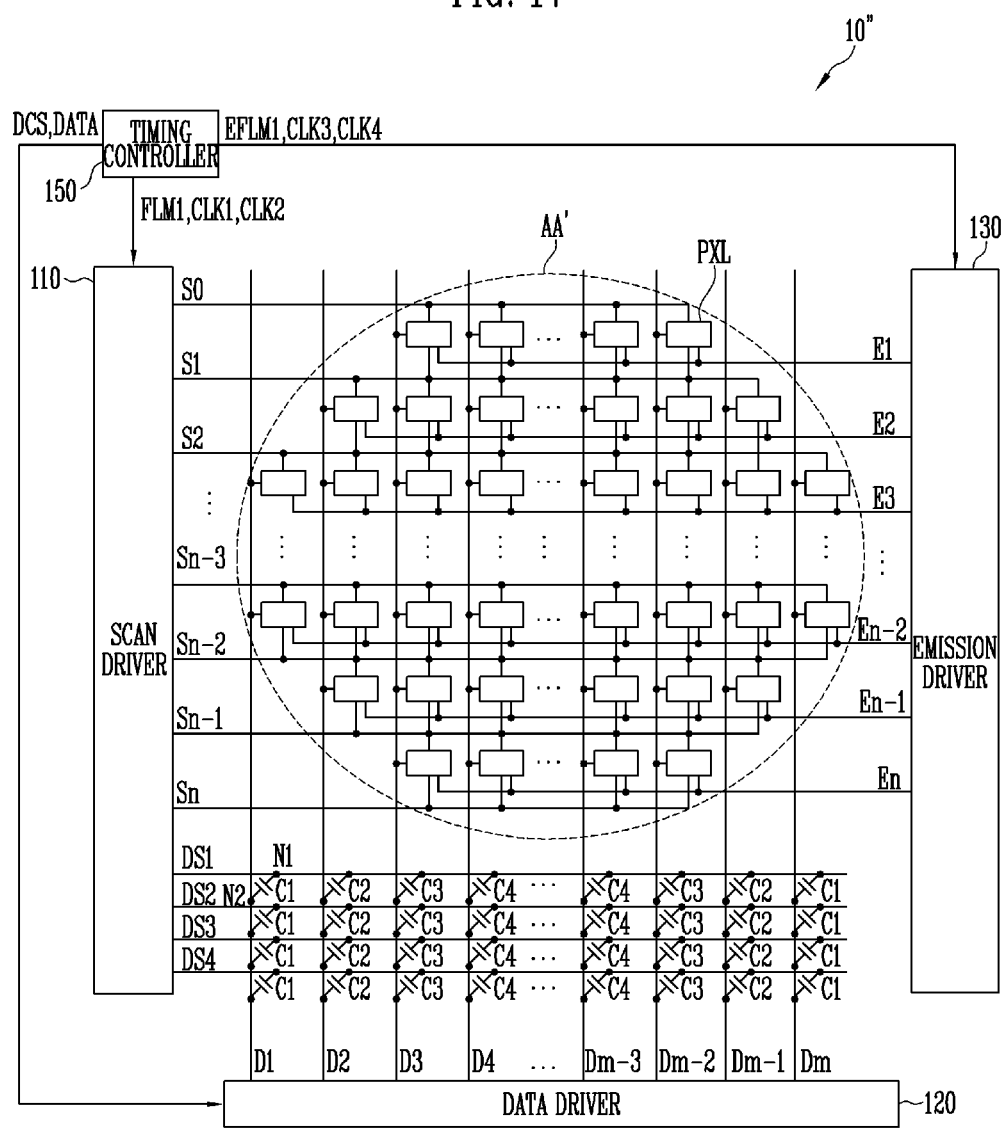
FIG. 17 is a view specifically illustrating a configuration of a display device according to still another exemplary embodiment of the present disclosure.

FIG. 17 is a view specifically illustrating a configuration of a display device according to still another exemplary embodiment of the present disclosure.

In FIG. 17, components identical to those of FIG. 1 are designated by like reference numerals, and descriptions of contents overlapping with those of FIG. 1 are omitted.

Referring to FIG. 17, the boundary of a display area AA' has a curve shape. For example, the display area AA' may have a circular or elliptical shape. In FIG. 17, it is illustrated that the display area AA' of the display device 10" has a circular shape. However, the remaining peripheral area except the display area AA' may have a circular shape to correspond to the shape of the display area AA', or may not have a curve shape.

Pixels PXL may be located in the display area AA'. The pixels PXL may be disposed to correspond to the shape of the display area AA'.

For example, the number of pixels PXL disposed on each of the first pixel row and the last pixel row is smallest, and a larger number of pixels PXL may be disposed on a pixel row as the pixel row becomes closer to the center of the display area AA'.

In addition, the number of pixels PXL disposed on each of the first pixel column (pixels PXL connected to the first data line D1) and the last pixel column (pixels PXL connected to the mth data line Dm) is smallest, and a larger number of pixels PXL may be disposed on a pixel column as the pixel column becomes closer to the center of the display area AA'.

That is, according to an exemplary embodiment of the present disclosure, numbers of pixels PXL located on pixel rows may be different for each area.

Meanwhile, in FIG. 17, lengths of the scan lines S0 to Sn are different from one another, but the present disclosure is not limited thereto. For example, the lengths of the scan lines S0 to Sn may be equal or similar to one another.

In addition, FIG. 17 illustrates that the lengths of the data lines D1 to Dm are equal or similar to one another, but the present disclosure is not limited thereto.

In addition, the length of each of the data lines D1 to Dm may be correspond to the number of pixels disposed on the corresponding pixel column. Specifically, the length of the data line may be increased as the data line become closer to the center of the display area AA'.

Each of the dummy scan lines DS1 to DS4 may be located to intersect the data lines D1 to Dm, a load matching capacitance may be formed in each of regions in which the dummy scan lines DS1 to DS4 and the data lines D1 to Dm intersect each other.

However, since numbers of pixels PXL connected to the respective data lines D1 to Dm are different from one another, magnitudes of Cdata of the respective data lines D1 to Dm may be different from one another. Thus, the magnitude of the load matching capacitance is designed to be changed depending on positions, so that the sum of the magnitudes of load matching capacitances of the respective data lines can be equal to the sum of the magnitudes of Cdata of the respective data lines.

For example, a first load matching capacitance C1 may be formed between the first data line D1 and the dummy scan lines DS1 to DS4 and between the last data line Dm and the dummy scan lines DS1 to DS4, a second load matching capacitance C2 may be formed between a second data line D2 and the dummy scan lines DS1 to DS4 and between an (m−1)th data line Dm-1 and the dummy scan lines DS1 to DS4, a third load matching capacitance C3 may be formed between a third data line D3 and the dummy scan lines DS1 to DS4 and between an (m−2)th data line Dm-2 and the dummy scan lines DS1 to DS4, and a fourth load matching capacitance C4 may be formed between a fourth data line D4 and the dummy scan lines DS1 to DS4 and between an (m−3)th data line Dm3 and the dummy scan lines DS1 to DS4.

In this case, the first load matching capacitance C1 may be greater than the second load matching capacitance C2, the second load matching capacitance C2 may be greater than the third load matching capacitance C3, and the third load matching capacitance C3 may be greater than the fourth load matching capacitance C4.

The magnitudes of the load matching capacitances C1 to C4 can be adjusted by adjusting an overlapping area of each of the dummy scan lines DS1 to DS4 and the first dummy electrode UEC1, an overlapping area of each of the dummy scan lines DS1 to DS4 and the first dummy active pattern ACT8, or an overlapping area of each of the dummy scan lines DS1 to DS4 and the second dummy active pattern ACT9.

According to the present disclosure, it is possible to provide a display device in which an image is displayed with uniform luminance.

Although certain exemplary embodiments and implementations have been described herein, other exemplary embodiments and modifications will be apparent from this description. Accordingly, the inventive concept is not limited to such exemplary embodiments, but rather to the broader scope of the presented claims and various obvious modifications and equivalent arrangements.

What is claimed is:

1. A display device comprising:
   pixels disposed in a display area;
   data lines connected to the pixels, the data lines configured to provide data signals to the pixels;
   scan lines connected to the pixels arranged in a row direction, the scan lines configured to provide scan signals to the pixels; and
   dummy scan lines crossing the data lines in a peripheral area surrounding the display area and configured to provide dummy scan signals,
   wherein:
   a capacitance is formed between a first node connected to a corresponding dummy scan line of the dummy scan lines and a second node connected to a corresponding data line of the data lines crossing the dummy scan lines; and
   when the dummy scan signals are supplied to the dummy scan lines, a level of a voltage supplied to the first node is changed from a high level to a low level, and a magnitude of a data signal supplied to pixels in a floating state is decreased.

2. The display device of claim 1, wherein the scan lines and the dummy scan lines extend in a first direction, and the data lines extend in a second direction crossing the first direction.

3. The display device of claim 1, wherein the dummy scan lines are not connected to the pixels.

4. The display device of claim 1, wherein:
   the scan signals are supplied earlier to the pixels disposed on first pixel rows than the pixels disposed on second pixel rows; and the second pixel rows are disposed under the first pixel rows.

5. The display device of claim 1, further comprising a scan driver configured to supply the scan signals to the scan lines, the scan driver configured to supply the dummy scan signals to the dummy scan lines.

6. The display device of claim 1, wherein:
each of the pixels comprises a transistor, the transistor comprising:
an active pattern;
a gate electrode disposed on the active pattern with a gate insulating layer interposed therebetween;
an interlayer insulating layer comprising a first interlayer insulating layer covering the gate electrode and a second interlayer insulating layer disposed on the first interlayer insulating layer; and
source and drain electrodes disposed on the interlayer insulating layer, the source and the drain electrodes each being connected to the active pattern;
the display device further comprises a first dummy electrode disposed on the first interlayer insulating layer; and
a portion of the first dummy electrode overlaps with the dummy scan lines such that the capacitance is formed between the first dummy electrode and the corresponding dummy scan line of the dummy scan lines.

7. The display device of claim 6, wherein the first dummy electrode is connected to a data line crossing a first dummy scan line through a contact hole passing through the second interlayer insulating layer.

8. The display device of claim 7, wherein a magnitude of a data signal supplied to the data line is changed corresponding to a change of a dummy scan signal supplied to the first dummy scan line.

9. The display device of claim 1, further comprising a first dummy active pattern disposed on a substrate,
wherein a portion of the first dummy active pattern overlaps with the dummy scan line such that the capacitance is formed between the first dummy active pattern and the dummy scan line.

10. The display device of claim 9, wherein the dummy scan line is connected to a data line intersecting the dummy scan line through contact holes passing through the gate insulating layer and the interlayer insulating layer.

11. The display device of claim 10, wherein the dummy scan line, the first dummy active pattern, and the data line form a first dummy transistor.

12. The display device of claim 10, wherein the magnitude of a data signal supplied to the data line is changed corresponding to a change of the dummy scan signal supplied to the dummy scan line.

13. The display device of claim 1, further comprising:
a second dummy active pattern disposed on the substrate;
a second dummy electrode disposed on the gate insulating layer; and
auxiliary data lines disposed on the interlayer insulating layer.

14. The display device of claim 13, wherein a portion of the second dummy active pattern overlaps with the second dummy electrode such that the capacitance is formed between the second dummy active pattern and the second dummy electrode.

15. The display device of claim 14, wherein:
first ends of the auxiliary data lines are connected to the second dummy active pattern through contact holes passing through the gate insulating layer and the interlayer insulating layer;
second ends of the auxiliary data lines are connected to the dummy scan line through contact holes passing through the interlayer insulating layer; and
the second auxiliary electrode is connected to a data line intersecting the dummy scan line through a contact hole through the interlayer insulating layer.

16. The display device of claim 15, wherein the second dummy active pattern, the second dummy electrode, and the auxiliary data lines form a second dummy transistor.

17. The display device of claim 15, wherein the magnitude of a data signal supplied to the data signal is changed corresponding to a change of the dummy scan signal supplied to the second dummy active pattern through the dummy scan line and the auxiliary data lines.

18. The display device of claim 1, wherein at least a portion of the boundary of the display area has a curved shape.

19. The display device of claim 18, wherein a capacitance is formed in each of intersection regions of the dummy scan lines and the data lines, and the magnitude of the capacitance is changed depending on regions.

20. The display device of claim 19, wherein the magnitude of a capacitance becomes greater as the capacitance is formed by a data line located closer to an outer portion.

* * * * *